US012777655B2

(12) United States Patent
Choi et al.

(10) Patent No.: US 12,777,655 B2
(45) Date of Patent: Oct. 27, 2026

(54) VERTICAL NON-VOLATILE MEMORY DEVICES WITH IMPROVED COUPLING AND METHODS FOR MANUFACTURING THE SAME

(71) Applicant: Samsung Electronics Co., Ltd., Suwon-si (KR)

(72) Inventors: Dongsung Choi, Suwon-si (KR); Byongju Kim, Suwon-si (KR); Youjung Kim, Suwon-si (KR); Chaeho Kim, Suwon-si (KR); Changheon Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 487 days.

(21) Appl. No.: 18/341,066

(22) Filed: Jun. 26, 2023

(65) Prior Publication Data

US 2024/0206180 A1 Jun. 20, 2024

(30) Foreign Application Priority Data

Dec. 15, 2022 (KR) ........................ 10-2022-0176216

(51) Int. Cl.
*H10B 43/35* (2023.01)
*H10B 43/27* (2023.01)

(52) U.S. Cl.
CPC ............. *H10B 43/35* (2023.02); *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44;
(Continued)

(56) References Cited

U.S. PATENT DOCUMENTS 9,153,597 B2 10/2015 Kim et al.
10,083,981 B2 * 9/2018 Daycock ................ H10B 43/27
(Continued)

FOREIGN PATENT DOCUMENTS

KR 10-2017-0026924 A 3/2017
KR 10-2021-0106293 A 8/2021

*Primary Examiner* — William B Partridge
*Assistant Examiner* — Gustavo G Ramallo
(74) *Attorney, Agent, or Firm* — Wolf, Greenfield & Sacks, P.C.

(57) ABSTRACT

A vertical non-volatile memory device may include a mold structure including first and second insulation patterns and a first gate electrode, a semiconductor pattern extending through the mold structure in a first direction, a first charge insulation layer between the first insulation pattern and the semiconductor pattern, a second charge insulation layer spaced apart from the first charge insulation layer and between the second insulation pattern and the semiconductor pattern, a charge storage layer between the first and second charge insulation layers and between the first gate electrode and the semiconductor pattern, and a first blocking insulation layer between the first gate electrode and the charge storage layer, and a first length in the first direction of the first gate electrode is shorter than a second length in the first direction of a first surface of the charge storage layer which is in contact with the first blocking insulation layer.

15 Claims, 21 Drawing Sheets

(58) Field of Classification Search
CPC ...... H10B 41/465; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 10,283,513 | B1 | 5/2019 | Zhou et al. | |
| 10,438,962 | B2 | 10/2019 | Kim | |
| 10,593,695 | B1 * | 3/2020 | Kim | H10B 43/27 |
| 10,777,576 | B1 | 9/2020 | Kim et al. | |
| 11,024,644 | B2 | 6/2021 | Hopkins et al. | |
| 11,289,501 | B2 | 3/2022 | Surthi et al. | |
| 11,309,330 | B2 | 4/2022 | Lee et al. | |
| 2017/0062471 | A1 | 3/2017 | Son et al. | |
| 2018/0151588 | A1 | 5/2018 | Tsutsumi et al. | |
| 2020/0373325 | A1 * | 11/2020 | Kim | G11C 16/08 |
| 2021/0104535 | A1 | 4/2021 | Yang et al. | |
| 2021/0265383 | A1 | 8/2021 | Kim et al. | |
| 2021/0399011 | A1 | 12/2021 | Kang et al. | |
| 2022/0077176 | A1 | 3/2022 | Surthi et al. | |
| 2023/0232631 | A1 | 7/2023 | Kim et al. | |

* cited by examiner

VERTICAL NON-VOLATILE MEMORY DEVICES WITH IMPROVED COUPLING AND METHODS FOR MANUFACTURING THE SAME

CROSS-REFERENCE TO RELATED APPLICATION

This application claims priority to and the benefit of Korean Patent Application No. 10-2022-0176216 filed in the Korean Intellectual Property Office on Dec. 15, 2022, the entire contents of which are incorporated herein by reference.

BACKGROUND

1. Field

The present disclosure relates to vertical non-volatile memory devices and methods for manufacturing the same.

2. Description of the Related Art

A semiconductor refers to a material which belongs to a region between a conductor and an insulator and has an electrical conductivity under a predetermined condition. Such a semiconductor material is used to manufacture various semiconductor devices, for example, a semiconductor memory device. The memory device is classified into a volatile memory device or a non-volatile memory device. In a non-volatile memory device, even though power is shut off, contents of the non-volatile memory device are not erased, and the non-volatile memory device may be used for various electronic apparatuses such as portable phones, digital cameras, or PCs.

In accordance with a recent trend of increasing a storage capacity, it is necessary to improve the integration of non-volatile memory devices. The integration of such memory devices which are two-dimensionally arranged on a plane may be limited. Accordingly, a vertical non-volatile memory device which is three-dimensionally arranged is being proposed.

SUMMARY

Aspects of the present disclosure may improve the reliability of semiconductor memory devices by arranging charge storage layers of vertical non-volatile memory devices to be spaced apart from each other.

According to some embodiments, a vertical non-volatile memory device includes a cell substrate, a mold structure that includes a first insulation pattern, a first gate electrode, and a second insulation pattern which are sequentially stacked on the cell substrate, a semiconductor pattern that extends through the mold structure in a first direction intersecting a top surface of the cell substrate, a first charge insulation layer between the first insulation pattern and the semiconductor pattern, a second charge insulation layer spaced apart from the first charge insulation layer and between the second insulation pattern and the semiconductor pattern, a charge storage layer between the first charge insulation layer and the second charge insulation layer and between the first gate electrode and the semiconductor pattern, and a first blocking insulation layer between the first gate electrode and the charge storage layer, and a first length in the first direction of the first gate electrode is shorter than a second length in the first direction of a first surface of the charge storage layer which is in contact with the first blocking insulation layer.

The first blocking insulation layer may be between the first charge insulation layer and the second charge insulation layer.

A third length in the first direction of a second surface of the charge storage layer which is opposite to the semiconductor pattern may be longer than the second length.

A fourth length in the first direction of the first blocking insulation layer may be longer than the first length.

The vertical non-volatile memory device may further include: a barrier layer between the first insulation pattern and the first gate electrode and between the second insulation pattern and the first gate electrode and a fifth length of the barrier layer along the first direction is shorter than the third length.

The barrier layer may be between the first blocking insulation layer and the first gate electrode.

The second charge insulation layer may include a material different from that of the second insulation pattern.

A length of the charge storage layer in the first direction may increase toward the semiconductor pattern.

The first charge insulation layer may include a material different from that of the first insulation pattern.

According to some embodiments, a vertical non-volatile memory device includes a cell substrate, a mold structure that includes a first gate electrode, an insulation pattern, and a second gate electrode which are sequentially stacked on the cell substrate, a semiconductor pattern that extends through the mold structure in a first direction intersecting a top surface of the cell substrate, a first charge storage layer between the first gate electrode and the semiconductor pattern, a second charge storage layer spaced apart from the first charge storage layer and between the second gate electrode and the semiconductor pattern, a first blocking insulation layer between the first gate electrode and the first charge storage layer, and a second blocking insulation layer spaced apart from the first blocking insulation layer and between the second gate electrode and the second charge storage layer, and a first distance between the first charge storage layer and the second charge storage layer is shorter than a second distance between the first gate electrode and the second gate electrode.

A third distance between the first blocking insulation layer and the second blocking insulation layer may be shorter than the second distance.

The first distance may decrease as the first and second charge storage layers extend closer to the semiconductor pattern.

The vertical non-volatile memory device may further include: a first barrier layer between the first gate electrode and the insulation pattern, and a second barrier layer between the second gate electrode and the insulation pattern, a fourth distance between the first barrier layer and the second barrier layer is shorter than the first distance.

The vertical non-volatile memory device may further include a charge insulation layer between the first charge storage layer and the second charge storage layer.

A surface of the first charge storage layer may be in contact with the charge insulation layer and have a concave shape.

The charge insulation layer may include a material different from that of the insulation pattern.

The charge insulation layer may be between the first blocking insulation layer and the second blocking insulation layer.

According to some embodiments, a method of manufacturing a vertical non-volatile memory device includes alternately forming a first sacrificial layer, an insulation pattern, and a second sacrificial layer on a cell substrate, forming a hole by etching the first sacrificial layer, the insulation pattern, and the second sacrificial layer, forming a first blocking insulation layer on the first sacrificial layer and forming a second blocking insulation layer that is spaced apart from the first blocking insulation layer and is on the second sacrificial layer, forming a preliminary charge storage layer on the insulation pattern, the first blocking insulation layer, and the second blocking insulation layer, forming a blocking pattern on the preliminary charge storage layer in a first region, the first region overlapping the insulation pattern, forming a mask on the preliminary charge storage layer in a second region, the second region being free of the blocking pattern, and performing an etching process to form a first charge storage layer and a second charge storage layer which are separated from each other.

The forming of the first blocking insulation layer and the second blocking insulation layer may include selectively forming a first seed insulation layer on the first sacrificial layer and selectively forming a second seed insulation layer which is spaced apart from the first seed insulation layer and is on the second sacrificial layer, and forming the first blocking insulation layer and the second blocking insulation layer by oxidizing the first seed insulation layer and the second seed insulation layer, respectively.

The method may further include: forming a charge insulation layer in a space between the first charge storage layer and the second charge storage layer and between the first blocking insulation layer and the second blocking insulation layer.

According to example embodiments, charge storage layers of vertical non-volatile memory devices are arranged to be spaced apart from each other to improve the reliability of the device.

DETAILED DESCRIPTION

Figure 1:
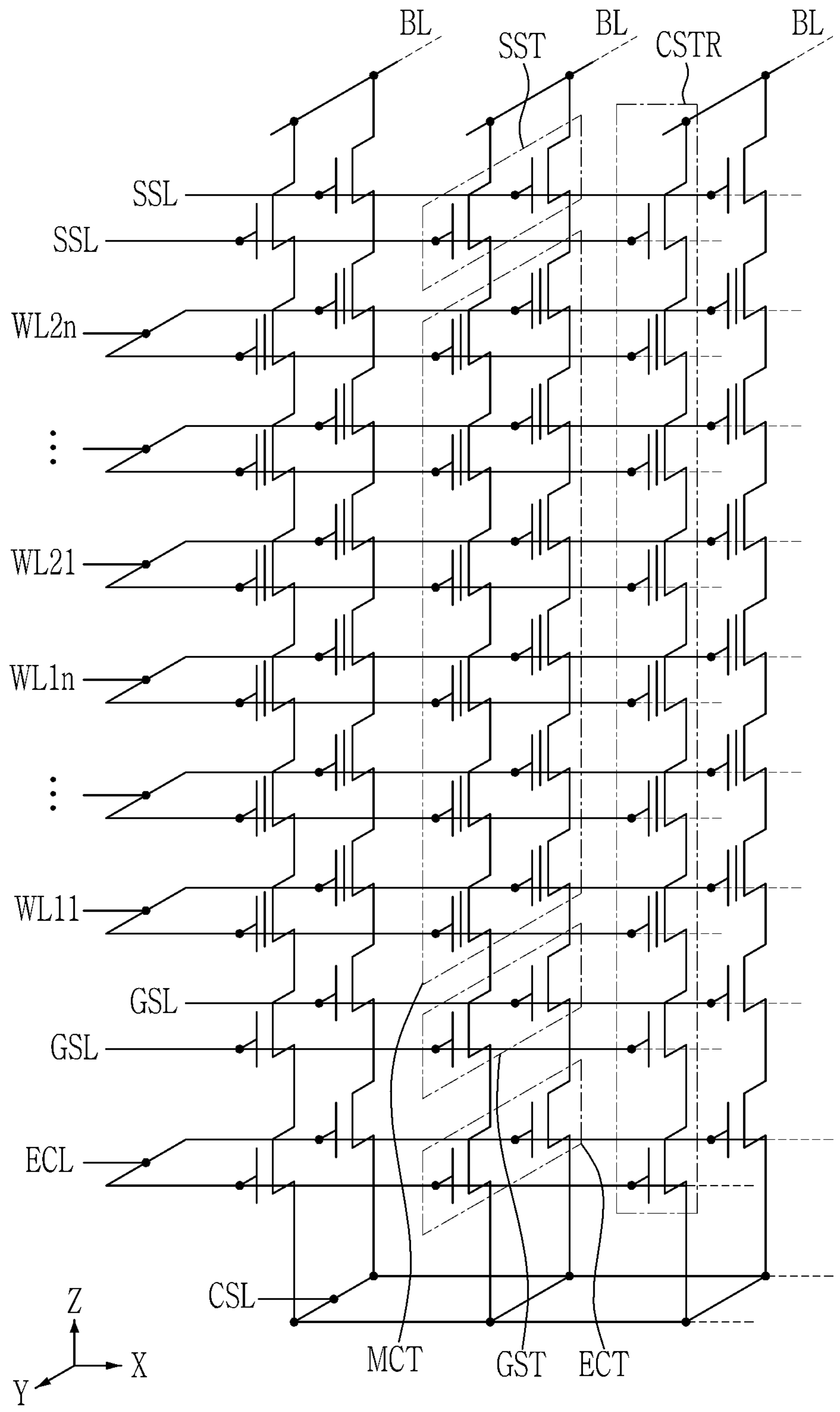
FIG. 1 is a schematic circuit diagram illustrating a vertical non-volatile memory device according to some embodiments.

Hereinafter, example embodiments will be described with reference to the accompanying drawings to be easily carried out by those skilled in the art. The present disclosure may be implemented in various different forms and is not limited to the example embodiments to be described hereinbelow.

In order to clearly describe the present disclosure, parts not related to the description will be omitted. Like reference numerals designate like elements throughout the specification.

The size and thickness of the components shown in the drawings are optionally determined for ease of description, and the present disclosure is not limited to the examples shown in the drawings. In the drawings, the thickness of layers, films, panels, regions, etc., may be exaggerated for clarity. In addition, in the drawings, for understanding and ease of description, the thicknesses of some layers and areas may be exaggerated.

It will be understood that when an element such as a layer, film, region, or substrate is referred to as being "on" another element, it can be "directly on" the other element or intervening elements may also be present. In contrast, when an element is referred to as being "directly on" another element, there are no intervening elements present. Further, to be located "above" or "on" a reference part means to be located above or below the reference part and not necessarily to be located "above" or "on" in an opposite direction to the gravity.

In addition, unless explicitly described to the contrary, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

Further, in the entire specification, the word "on a flat surface" means when an object portion is viewed from the above, and the word "on a cross section" means when a cross section taken by vertically cutting an object portion is viewed from the side.

Hereinafter, a vertical non-volatile memory device according to some embodiments will be described with reference to FIGS. 1 to 12.

Figure 2:
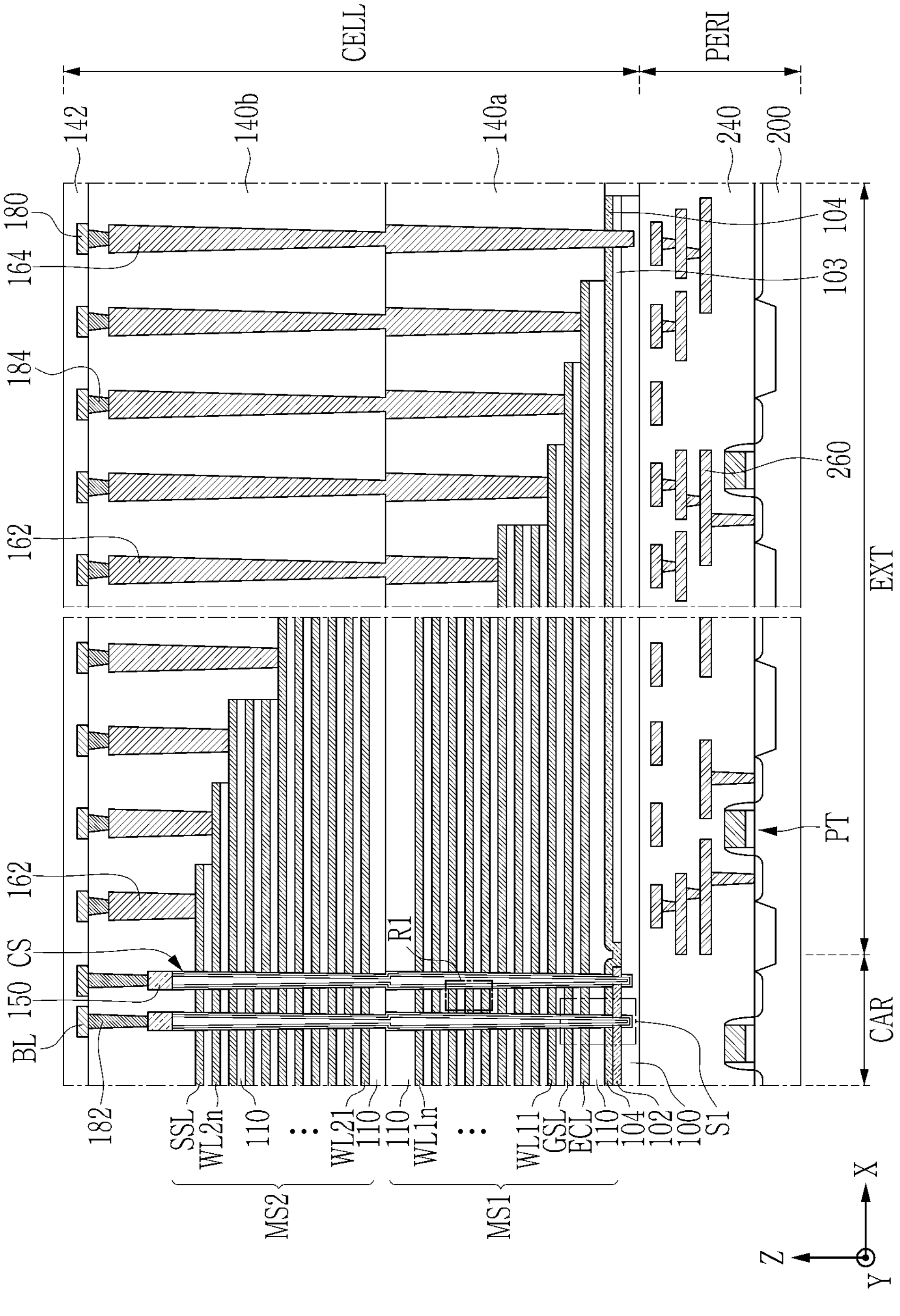
FIG. 2 is a cross-sectional view illustrating a vertical non-volatile memory device according to some embodiments.
Figure 3:
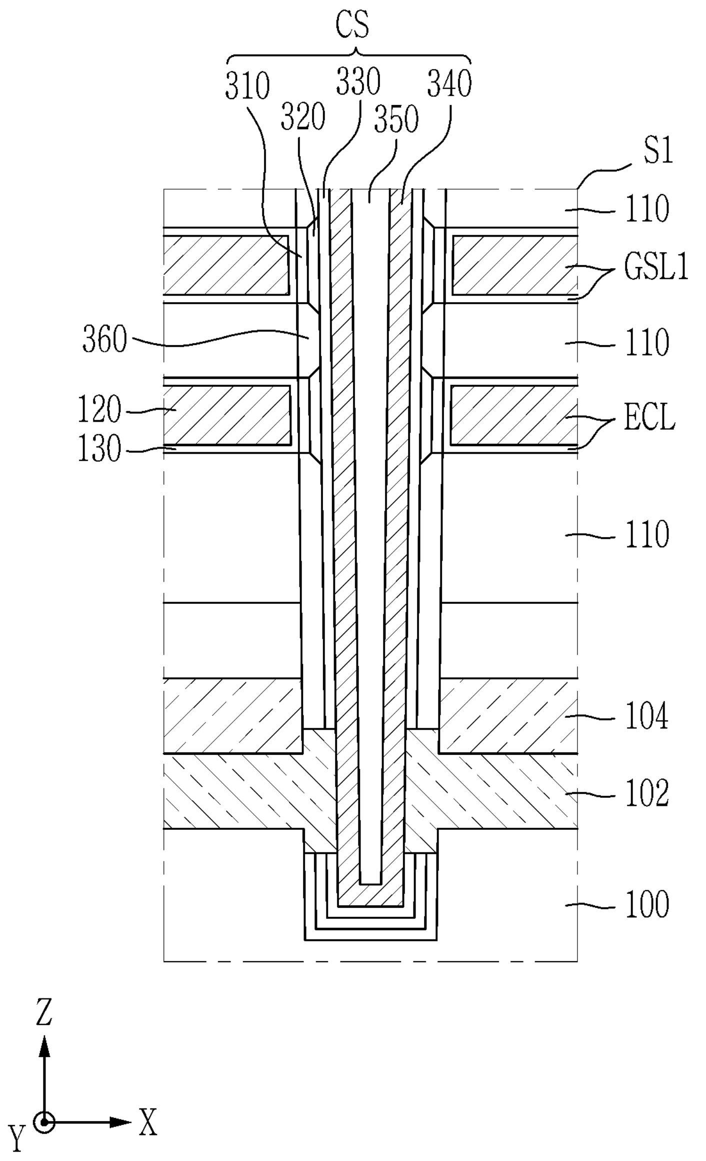
FIG. 3 is a cross-sectional view enlarging a region S1 of FIG. 2.
Figure 4:
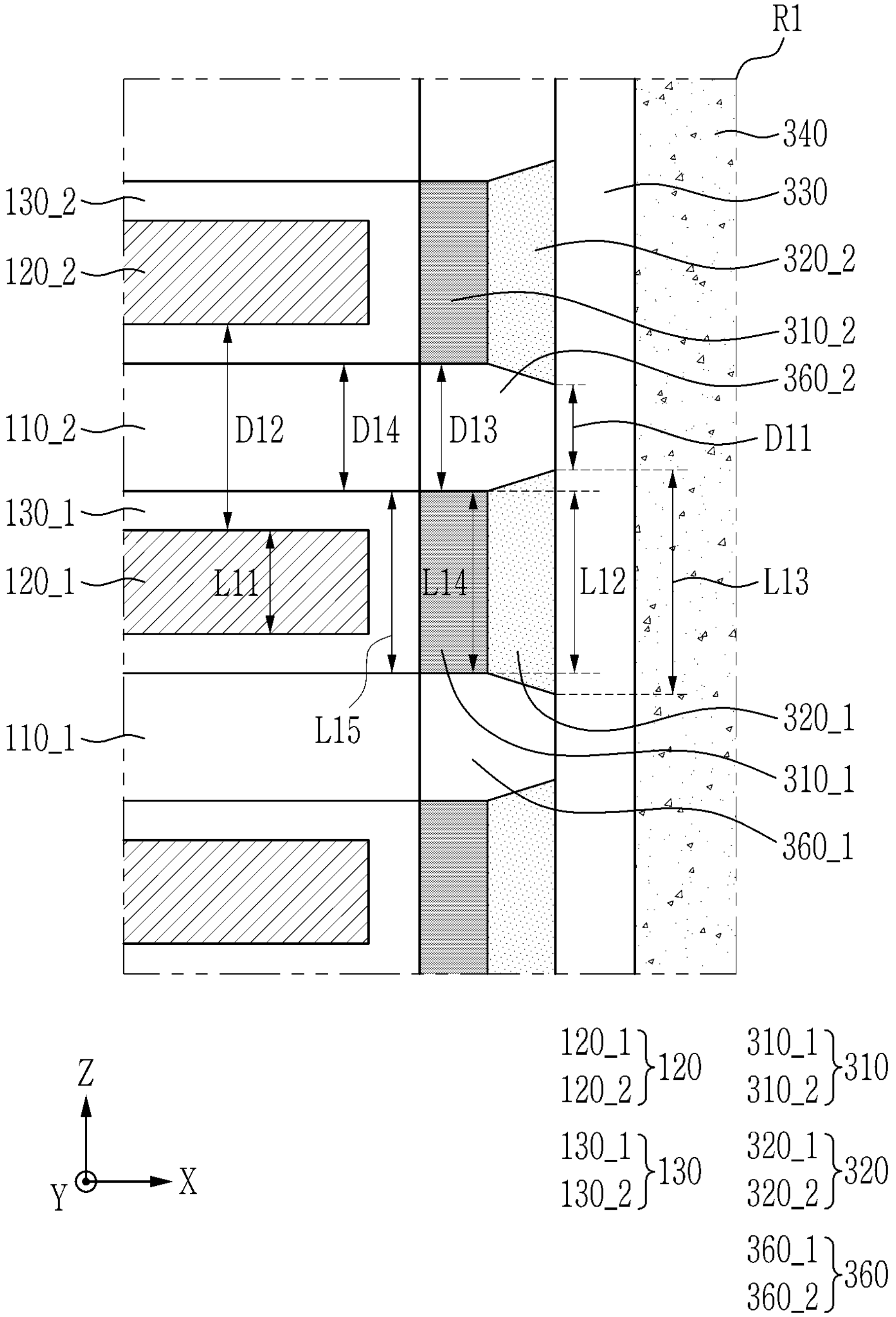
FIG. 4 is a cross-sectional view enlarging a region R1 of FIG. 2.

FIG. 1 is a schematic circuit diagram illustrating a vertical non-volatile memory device according to some embodiments, and FIG. 2 is a cross-sectional view illustrating a vertical non-volatile memory device according to some embodiments. Further, FIG. 3 is a cross-sectional view enlarging a region S1 of FIG. 2, and FIG. 4 is a cross-sectional view enlarging a region R1 of FIG. 2.

Referring to FIG. 1, a vertical non-volatile memory device according to some embodiments may include a common source line CSL, a plurality of bit lines BL, and a plurality of cell strings CSTR.

The plurality of bit lines BL may be two-dimensionally disposed. For example, the bit lines BL may be spaced apart from each other to extend in a second direction (Y direction). The plurality of cell strings CSTR may be coupled to the bit lines BL in parallel. The cell strings CSTR may be commonly coupled to the common source line CSL. That is, the plurality of cell strings CSTR may be disposed between the plurality of bit lines BL and the common source line CSL.

In some embodiments, the plurality of common source lines CSL may be two-dimensionally disposed. For example, the common source lines CSL may be spaced apart from each other to extend in a first direction (X direction). The electrically same voltage may be applied to the common source lines CSL, or different voltages may be applied to the common source lines to be separately controlled.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistors MCT may include a data storage element. The ground selection transistor GST, the string selection transistor SST, and the memory cell transistors MCT may be coupled in series.

The common source line CSL may be commonly coupled to sources of the ground selection transistor GST. Further, a ground selection line GSL, a plurality of first memory word lines WL11 to WL1*n*, a plurality of second memory word lines WL21 to WL2*n*, and a string selection line SSL may be disposed between the common source line CSL and the bit lines BL. The ground selection lines GSL may be used as a gate electrode of the ground selection transistor GST, the plurality of first memory word lines WL11 to WL1*n* and the plurality of second memory word lines WL21 to WL2*n* may be used as gate electrodes of the memory cell transistors MCT, and the string selection line SSL may be used as a gate electrode of the string selection transistor SST.

An erase control transistor ECT may be disposed between the common source line CSL and the ground selection transistor GST. The common source line CSL may be commonly coupled to sources of the erase control transistors ECT. Further, an erase control line ECL may be disposed between the common source line CSL and the ground selection line GSL. The erase control line ECL may be used as a gate electrode of the erase control transistor ECT. The erase control transistors ECT may generate a gate induced drain leakage (GIDL) to perform an erase operation of a plurality of memory cell transistors MCT.

Referring to FIGS. 1 to 4, a semiconductor memory apparatus according to some embodiments may include a memory cell region CELL and a peripheral circuit region PERI.

The memory cell region CELL may include a cell substrate 100, mold structures MS1 and MS2, interlayer insulating layers 140*a* and 140*b*, a channel structure CS, a bit line BL, a cell contact 162, a source contact 164, and a first wire structure 180.

The cell substrate 100 may include, for example, a semiconductor substrate such as a silicon substrate, a germanium substrate, or a silicon-germanium substrate. Alternatively, the cell substrate 100 may include a silicon-on-insulator (SOI) substrate or a germanium-on-insulator (GOI) substrate. In some embodiments, the cell substrate 100 may include an impurity. For example, the cell substrate 100 may include an N-type impurity (for example, phosphorus P, or arsenic As).

The cell substrate 100 may include a cell array region CAR and an extended region EXT.

In the cell array region CAR, a memory cell array including a plurality of memory cells may be formed. For example, a channel structure CS, a bit line BL, and an erase control line ECL, a ground selection line GSL, word lines WL11 to WL1*n*, WL21 to WL2*n*, and a string selection line SSL, which will be described below, may be disposed in the cell array region CAR. For convenience of description, ECL, GSL, WL11 to WL1*n*, WL21 to WL2*n*, and SSL may be collectively referred to as "word lines" herein. In the following description, a surface of the cell substrate 100 on which the memory cell array is disposed is referred to as a front surface (front side) of the cell substrate 100. In contrast, a surface of the cell substrate 100 which is opposite to the front surface of the cell substrate 100 may be referred to as a back surface (back side) of the cell substrate 100.

The extended region EXT may be disposed in the vicinity of the cell array region CAR. For example, the extended region EXT may be adjacent to the cell array region CAR. In the extended region EXT, the word lines ECL, GSL, WL11 to WL1*n*, WL21 to WL2*n*, and SSL may be laminated or stacked as steps which will be described below. In some embodiments, the cell substrate 100 may further include a penetration region. The penetration region may be disposed inside the cell array region CAR and the extended region EXT or disposed outside the cell array region CAR and the extended region EXT.

The mold structures MS1 and MS2 may be disposed on the front surface of the cell substrate 100. The mold structures MS1 and MS2 may include the plurality of word lines ECL, GSL, WL11 to WL1*n*, WL21 to WL2*n*, and SSL and a plurality of insulation patterns 110 laminated or stacked on the cell substrate 100. Each of the word lines ECL, GSL, WL11 to WL1*n*, WL21 to WL2*n*, and SSL and each insulation pattern 110 may be a layered structure which extends to be parallel to the front surface of the cell substrate 100. The word lines ECL, GSL, WL11 to WL1*n*, WL21 to WL2*n*, and SSL may be spaced apart from each other by the insulation patterns 110 to be sequentially laminated or stacked on the cell substrate 100.

In some embodiments, the mold structures MS1 and MS2 may include a first mold structure MS1 and a second mold structure MS2 which are sequentially laminated or stacked on the cell substrate 100.

The first mold structure MS1 may include first word lines ECL, GSL, and WL11 to WL1*n* and the insulation patterns 110 which are alternately laminated or stacked on the cell substrate 100. In some embodiments, the first word lines ECL, GSL, WL11 to WL1*n* may include the erase control line ECL, the ground selection line GSL, and the plurality of first memory word lines WL11 to WL1*n* which are sequentially laminated or stacked on the cell substrate 100. Even though it is illustrated that the first word lines ECL, GSL, WL11 to WL1*n* include only one ground selection line GSL, it is merely illustrative, and the first word lines ECL, GSL, WL11 to WL1*n* may also include two or more ground selection lines. In some other embodiments, the erase control line ECL may be omitted.

The second mold structure MS2 may include second word lines WL21 to WL2*n*, and SSL and the insulation patterns 110 which are alternately laminated or stacked on the first mold structure MS1. In some embodiments, the second word lines WL21 to WL2*n* and SSL may include a plurality of second memory word lines WL21 to WL2*n* and a string selection line SSL which are sequentially laminated or stacked on the first mold structure MS1. Even though it is illustrated that the second word lines WL21 to WL2*n* and SSL include only one string selection line SSL, it is merely illustrative, and the second word lines WL21 to WL2*n* and SSL may also include two or more string selection lines.

The word lines ECL, GSL, WL11 to WL1*n*, WL21 to WL2*n* and SSL and the insulation patterns 110 may be alternately laminated or stacked. For example, the word lines ECL, GSL, WL11 to WL1*n*, WL21 to WL2*n*, and SSL may be spaced apart from each other on the cell substrate 100 along a third direction (Z direction) and be sequentially laminated or stacked. For example, the first direction (X direction) and the second direction (Y direction) may extend parallel to a top surface of the cell substrate 100 and may be perpendicular to each other. For example, the third direction (Z direction) may extend perpendicular to a top surface of the cell substrate 100 and may be perpendicular to the first direction (X direction) and the second direction (Y direction). For example, the third direction (Z direction) may intersect a top surface of the cell substrate 100. The plurality of insulation patterns 110 may be interposed between the word lines ECL, GSL, WL11 to WL1$n$, WL21 to WL2$n$, and SSL and between the word lines ECL, GSL, WL11 to WL1$n$, WL21 to WL2$n$, and SSL and the cell substrate 100. For example, as illustrated in FIG. 4, the mold structures MS1 and MS2 may include a first insulation pattern 110_1, a first gate electrode 120_1, a second insulation pattern 110_2, and a second gate electrode 120_2 which are sequentially laminated or stacked on the cell substrate 100.

Even though it is illustrated that the word lines ECL, GSL, WL11 to WL1$n$, WL21 to WL2$n$, and SSL have the same thickness, the present disclosure is not limited thereto and the word lines ECL, GSL, WL11 to WL1$n$, WL21 to WL2$n$, and SSL may have different thicknesses.

Each of the plurality of word lines ECL, GSL, WL11 to WL1$n$, WL21 to WL2$n$, and SSL may include gate electrodes 120 (e.g., see FIGS. 3 and 4) and a barrier layer 130 (e.g., see FIGS. 3 and 4). The gate electrodes 120 include a conductive material. For example, the gate electrodes 120 may include metals such as tungsten (W), cobalt (Co), and nickel (Ni) or a semiconductor material such as silicon (Si), but are not limited thereto.

The barrier layer 130 may be disposed on each gate electrode 120 and may enclose or at least partially surround each gate electrode 120. For example, as illustrated in FIG. 4, the barrier layer 130 may include a first barrier layer 130_1 which encloses or at least partially surrounds the first gate electrode 120_1 and a second barrier layer 130_2 which encloses or at least partially surrounds the second gate electrode 120_2.

The barrier layer 130 may extend along bottom surfaces, sidewalls, and top surfaces of word lines ECL, GSL, WL11 to WL1$n$, WL21 to WL2$n$, and SSL. For example, as illustrated in FIG. 4, a lower portion of the first barrier layer 130_1 is interposed between the first gate electrode 120_1 and the first insulation pattern 110_1, a side portion of first barrier layer 130_1 is interposed between the first gate electrode 120_1 and a first blocking insulation layer 310_1, and an upper portion of the first barrier layer 130_1 is interposed between the first gate electrode 120_1 and the second insulation pattern 110_2.

For example, the barrier layer 130 may include silicon oxide or a high dielectric constant material having a dielectric constant higher than that of silicon oxide. For example, the high dielectric constant material may include at least one of aluminum oxide, hafnium oxide, lanthanum oxide, tantalum oxide, titanium oxide, lanthanum hafnium oxide, lanthanum aluminum oxide, dysprosium scandium oxide, or a combination thereof.

The plurality of insulation patterns 110 include an insulating material. The plurality of insulation patterns 110 may include, for example, at least one of silicon oxide, silicon nitride, or silicon oxynitride, but is not limited thereto.

The interlayer insulating layers 140$a$ and 140$b$ may be formed on the cell substrate 100 to cover or be on the mold structures MS1 and MS2. In some embodiments, the interlayer insulating layers 140$a$ and 140$b$ may include a first interlayer insulating layer 140$a$ and a second interlayer insulating layer 140$b$ which are sequentially laminated or stacked on the cell substrate 100. The first interlayer insulating layer 140$a$ may cover or be on the first mold structure MS1 and the second interlayer insulating layer 140$b$ may cover or be on the second mold structure MS2. The interlayer insulating layers 140$a$ and 140$b$ may include at least one of silicon oxide, silicon oxy nitride, or a low dielectric constant (low-k) material having a dielectric constant lower than that of silicon oxide, but are not limited thereto.

The channel structure CS may pass or extend through the mold structures MS1 and MS2 to extend in the third direction (Z direction). For example, the channel structure CS may be formed on the cell substrate 100 with a pillar shape to pass or extend through the word lines ECL, GSL, WL11 to WL1$n$, WL21 to WL2$n$, and SSL and a plurality of insulation patterns 110. However, the shape of the channel structure CS is not limited thereto and may be changed to have various shapes. For example, the channel structure CS may be in the shape of a polygonal column or an elliptical column. Accordingly, the plurality of word lines ECL, GSL, WL11 to WL1$n$, WL21 to WL2$n$, and SSL may intersect the channel structure CS. In some embodiments, the channel structure CS may have a bent portion between the first mold structure MS1 and the second mold structure MS2.

Referring to FIGS. 3 and 4, the channel structure CS may include a semiconductor pattern 340 and a filler insulation pattern 350 disposed inside the semiconductor pattern 340. The channel structure CS may also include a tunnel insulation layer 330, charge storage layers 320, and blocking insulation layers 310 which are sequentially laminated or stacked at the outside of the semiconductor pattern 340.

The semiconductor pattern 340 may pass or extend through the mold structures MS1 and MS2 (e.g., see FIG. 3). For example, the semiconductor pattern 340 may extend in the third direction (Z direction). For example, the semiconductor pattern 340 may be formed to have a cup shape. For example, the channel structure CS may include a filler insulation pattern 350 having a pillar shape and a semiconductor pattern 340 which conformally extends along a bottom surface and a sidewall of the filler insulation pattern 350. For example, the filler insulation pattern 350 may include silicon oxide. However, a semiconductor pattern 340 of a channel structure CS of a vertical non-volatile memory device according to some embodiments may have various shapes such as a cylinder shape, a polygonal columnar shape, or a filled pillar shape. For example, the semiconductor pattern 340 may include a semiconductor material such as polysilicon.

A tunnel insulation layer 330 may be disposed on a sidewall of the channel structure CS. For example, the tunnel insulation layer 330 may be disposed to enclose or at least partially surround the sidewall of the semiconductor pattern 340. Further, the tunnel insulation layer 330 may extend in the third direction (Z direction).

For example, the tunnel insulation layer 330 may include silicon oxide or silicon oxy nitride. Alternatively, for example, the tunnel insulation layer 330 may be formed by a bilayer of a silicon oxide layer and a silicon nitride layer. For better understanding and ease of description, hereinafter, it is described that the tunnel insulation layer 330 includes silicon oxide.

Referring to FIGS. 3 and 4, a charge insulation layer 360 may be disposed on the sidewall of the tunnel insulation layer 330. The charge insulation layer 360 may be interposed between the tunnel insulation layer 330 and the insulation patterns 110. For example, as illustrated in FIG. 4, the first charge insulation layer 360_1 may be interposed between the first insulation pattern 110_1 and the tunnel insulation layer 330, and the second charge insulation layer 360_2 may be interposed between the second insulation pattern 110_2 and the tunnel insulation layer 330.

Further, the charge insulation layers 360 may be disposed to be spaced apart from each other along the third direction (Z direction). For example, as illustrated in FIG. 4, the first charge insulation layer 360_1 and the second charge insulation layer 360_2 may be disposed to be spaced apart from each other in the third direction (Z direction). Further, as it will be described below, the second charge insulation layer 360_2 may be interposed between the first charge storage layer 320_1 and the second charge storage layer 320_2.

The charge insulation layer 360 includes an insulating material. Further, the charge insulation layer 360 may include a material which is different from that of the insulation patterns 110. For example, the first charge insulation layer 360_1 and the second charge insulation layer 360_2 may include silicon oxy carbide, and the first insulation pattern 110_1 and the second insulation pattern 110_2 may include silicon oxide. However, the present disclosure is not limited thereto and the charge insulation layer 360 may include the same material as the insulation patterns 110. That is, the charge insulation layer 360 may include silicon oxide. Charge storage layers 320 may be disposed on a sidewall of the tunnel insulation layer 330. Accordingly, the tunnel insulation layer 330 may be interposed between the semiconductor pattern 340 and the charge storage layers 320. Further, each of the charge storage layers 320 may be located between the charge insulation layers 360, and each of the charge storage layers 320 may extend in the third direction (Z direction).

Each charge storage layer 320 may be interposed between the semiconductor pattern 340 and the word lines ECL, GSL, WL11 to WL1*n*, WL21 to WL2*n*, and SSL. For example, as illustrated in FIG. 4, the first charge storage layer 320_1 may be interposed between the semiconductor pattern 340 and the first gate electrode 120_1, and the second charge storage layer 320_2 may be interposed between the semiconductor pattern 340 and the second gate electrode 120_2. There may be a portion between the first insulation pattern 110_1 and the tunnel insulation layer 330 where the charge storage layer 320 is not located. Further, there may be a portion between the second insulation pattern 110_2 and the tunnel insulation layer 330 where the charge storage layer 320 is not located.

Accordingly, the charge storage layers 320 may be disposed to be spaced apart from each other along the third direction (Z direction). For example, as illustrated in FIG. 4, the first charge storage layer 320_1 and the second charge storage layer 320_2 may be disposed to be spaced apart from each other in the third direction (Z direction). Further, the first charge storage layer 320_1 may be interposed between the first charge insulation layer 360_1 and the second charge insulation layer 360_2. Accordingly, the first charge storage layer 320_1 and the second charge storage layer 320_2 may be spaced apart from each other by the second charge insulation layer 360_2. For example, the first charge storage layer 320_1 and the second charge storage layer 320_2 may be spaced apart from each other with the second charge insulation layer 360_2 therebetween. That is, the charge storage layers 320 may be located between the charge insulation layers 360. For example, respective ones of the charge storage layers 320 may be located between adjacent ones of the charge insulation layers 360 in the third direction (Z direction).

An extending length of each charge storage layer 320 along the third direction (Z direction) may be increased as it is closer to the semiconductor pattern 340. For example, a length of each charge storage layer 320 in the third direction (Z direction) may increase toward the semiconductor pattern 340. In some embodiments, as illustrated in FIG. 4, a cross-section of each charge storage layer 320 may have a trapezoid shape. For example, a second length L12 of a contact surface of the first charge storage layer 320_1 and a first blocking insulation layer 310_1 may be shorter than a third length L13 of a surface of the first charge storage layer 320_1 which is opposite to the semiconductor pattern 340. For example, a second length L12 of a surface of the first charge storage layer 320_1 which is in contact with the first blocking insulation layer 310_1 may be shorter than a third length L13 of a surface of the first charge storage layer 320_1 which is opposite to the semiconductor pattern 340. For example, the surface of the first charge storage layer 320_1 that is opposite to the semiconductor pattern 340 may contact the tunnel insulation layer 330. Here, the second length L12 and the third length L13 may be lengths of the charge storage layers 320 extending in the third direction (Z direction). Hereinafter, the second length L12 is defined as a length along the third direction (Z direction) of a contact surface of the first charge storage layer 320_1 and the first blocking insulation layer 310_1, and the third length L13 is defined as a length along the third direction (Z direction) of a surface of the first charge storage layer 320_1 which is opposite to the semiconductor pattern 340. The surface of the first charge storage layer 320_1 which is in contact with the first blocking insulation layer 310_1 may be referred to as a first surface of the first charge storage layer 320_1, and the surface of the first charge storage layer 320_1 which is opposite to the semiconductor pattern 340 may be referred to as a second surface of the first charge storage layer 320_1.

Further, each charge storage layer 320 may extend in the third direction (Z direction) to be longer than the gate electrodes 120 in the third direction (Z direction). For example, the second length L12 of the first charge storage layer 320_1 may be longer than the first length L11 of the first gate electrode 120_1 along the third direction (Z direction). Further, the third length L13 of the first charge storage layer 320_1 may be longer than the first length L11 of the first gate electrode 120_1 along the third direction (Z direction).

Each charge storage layer 320 may extend in the third direction (Z direction) to be longer than barrier layer 130. For example, the third length L13 of the first charge storage layer 320_1 may be longer than a fifth length L15 of the barrier layer 130 along the third direction (Z direction). In other words, the charge storage layers 320 may extend in the third direction (Z direction) to be longer than each of the word lines ECL, GSL, WL11 to WL1*n*, WL21 to WL2*n*, and SSL.

Further, charge storage layers 320 overlapping the gate electrodes 120 in the first direction (X direction) may have uniform thicknesses along the first direction (X direction). For example, the charge storage layers 320 may overlap the gate electrodes 120 in the first direction (X direction), and portions of the charge storage layers 320 that overlap the gate electrodes 120 in the first direction (X direction) may have uniform thicknesses along the first direction (X direction). For example, the first charge storage layer 320_1 overlapping the first gate electrode 120_1 in the first direction (X direction) may have a uniform thickness along the first direction (X direction), and the second charge storage layer 320_2 overlapping the second gate electrode 120_2 in the first direction (X direction) may have a uniform thickness along the first direction (X direction). As used herein, "an element A overlapping an element B in a direction X" (or similar language) means that there is at least one line that extends in the direction X and intersects both the elements A and B.

Charges which pass through the tunnel insulation layer 330 from the semiconductor pattern 340 may be stored in the charge storage layers 320. Charges stored in the charge storage layers 320 may be changed by the fowler-nordheim tunneling caused by a voltage difference between the semiconductor pattern 340 and the word lines ECL, GSL, WL11 to WL1*n*, WL21 to WL2*n*, and SSL.

The charge storage layers 320 may include, for example, at least one of silicon nitride, silicon oxy nitride, silicon rich nitride (Si-rich nitride) or nanocrystalline silicon (nanocrystalline Si). Here, the nanocrystalline silicon may be silicon having crystal particles having a size of several nanometer. For better understanding and ease of description, hereinafter it is described that the charge storage layers 320 include silicon nitride.

Even though FIG. 4 illustrates that each of the charge storage layers 320 is formed to have the same trapezoid shape, the present disclosure is not limited thereto and the charge storage layers 320 may have different shapes.

The blocking insulation layers 310 may be disposed on sidewalls of the charge storage layers 320. Accordingly, the charge storage layers 320 may be interposed between the tunnel insulation layer 330 and the blocking insulation layers 310. Further, each blocking insulation layer 310 may be located between the charge insulation layers 360, and each blocking insulation layer 310 may extend in the third direction (Z direction).

Each blocking insulation layer 310 may be interposed between corresponding charge storage layer 320 and corresponding one of word lines ECL, GSL, WL11 to WL1*n*, WL21 to WL2*n*, and SSL. For example, as illustrated in FIG. 4, the first blocking insulation layer 310_1 may be interposed between the first charge storage layer 320_1 and the first gate electrode 120_1, and the second blocking insulation layer 310_2 may be interposed between the second charge storage layer 320_2 and the second gate electrode 120_2. There may be a portion between the first insulation pattern 110_1 and the tunnel insulation layer 330 where the blocking insulation layer 310 is not located. Further, there may be a portion between the second insulation pattern 110_2 and the tunnel insulation layer 330 where the blocking insulation layer 310 is not located. Accordingly, the blocking insulation layers 310 may be disposed to be spaced apart from each other along the third direction (Z direction). For example, as illustrated in FIG. 4, the first blocking insulation layer 310_1 and the second blocking insulation layer 310_2 may be disposed to be spaced apart from each other in the third direction (Z direction). Further, the first blocking insulation layer 310_1 may be interposed between the first charge insulation layer 360_1 and the second charge insulation layer 360_2. Accordingly, the first blocking insulation layer 310_1 and the second blocking insulation layer 310_2 may be spaced apart from each other by the second charge insulation layer 360_2. Accordingly, the blocking insulation layers 310 may be disposed between the charge insulation layers 360. For example, respective ones of the blocking insulation layers 310 may be between adjacent ones of the charge insulation layers 360 in the third direction (Z direction).

In some embodiments, each blocking insulation layer 310 may extend in the third direction (Z direction) to be longer than the gate electrodes 120. For example, a fourth length L14 of the first blocking insulation layer 310_1 along the third direction (Z direction) may be longer than the first length L11 of the first gate electrode 120_1.

Each blocking insulation layer 310 may extend in the third direction (Z direction) to be longer than each barrier layer 130. For example, the fourth length L14 of the first blocking insulation layer 310_1 may be longer than a fifth length L15 of the barrier layer 130 (e.g., a first barrier layer 130_1) along the third direction (Z direction).

Each blocking insulation layer 310 may extend in the third direction (Z direction) shorter than the charge storage layers 320. For example, the fourth length L14 of the first blocking insulation layer 310_1 along the third direction (Z direction) may be shorter than the third length L13 of the first charge storage layer 320_1. However, the present disclosure is not limited thereto and the fourth length L14 of the first blocking insulation layer 310_1 may be equal to or longer than the third length L13 of the first charge storage layer 320_1.

For example, the blocking insulation layers 310 may include silicon oxide or a high dielectric constant material having a dielectric constant higher than that of silicon oxide. For example, the high dielectric constant material may include at least one of aluminum oxide, hafnium oxide, lanthanum oxide, tantalum oxide, titanium oxide, lanthanum hafnium oxide, lanthanum aluminum oxide, dysprosium scandium oxide, or a combination thereof. For better understanding and ease of description, hereinafter, it is described that the blocking insulation layers 310 include silicon oxide.

Accordingly, the charge insulation layer 360 may be interposed between the blocking insulation layers 310 and between the charge storage layers 320. That is, the blocking insulation layers 310 and the charge storage layers 320 may be located between the charge insulation layers 360 to so that the blocking insulation layers 310 are spaced apart from each other and the charge storage layers 320 are spaced apart from each other. Accordingly, the charge insulation layer 360 may serve to separate between the charge storage layers 320 and to separate between the blocking insulation layers 310. In other words, adjacent ones of the charge storage layers 320 in the third direction (Z direction) may be spaced apart from each other with a respective one of the charge insulation layers 360 therebetween, and adjacent ones of the blocking insulation layers 310 in the third direction (Z direction) may be spaced apart from each other with a respective one of the charge insulation layers 360 therebetween. For example, as illustrated in FIG. 4, a distance between the charge storage layers 320 may be shorter than a distance between the gate electrodes 120. For example, a first distance D11 between the first charge storage layer 320_1 and the second charge storage layer 320_2 may be smaller than a second distance D12 between the first gate electrode 120_1 and the second gate electrode 120_2. Here, the first distance D11 refers to a shortest distance between the first charge storage layer 320_1 and the second charge storage layer 320_2. For example, a distance between the first charge storage layer 320_1 and the second charge storage layer 320_2 may vary. For example, a distance between the first charge storage layer 320_1 and the second charge storage layer 320_2 may decrease as the first and second charge storage layers 320_1 and 320_2 extend closer to the semiconductor pattern 340. Accordingly, the first distance D11 may be the shortest distance between the first charge storage layer 320_1 and the second charge storage layer 320_2.

Further, the distance between the charge storage layers 320 may be shorter than the distance between the barrier layers 130. For example, the first distance D11 between the first charge storage layer 320_1 and the second charge storage layer 320_2 may be shorter than the fourth distance D14 between the first barrier layer 130_1 and the second barrier layer 130_2 which are adjacent to each other.

A distance between the blocking insulation layers 310 may be longer than a distance between the charge storage layers 320. For example, a third distance D13 between the first blocking insulation layer 310_1 and the second blocking insulation layer 310_2 may be longer than the first distance D11 between the first charge storage layer 320_1 and the second charge storage layer 320_2. The distance between the blocking insulation layers 310 may be shorter than the distance between the gate electrodes 120. For example, the third distance D13 between the first blocking insulation layer 310_1 and the second blocking insulation layer 310_2 may be shorter than the second distance D12 between the first gate electrode 120_1 and the second gate electrode 120_2.

Referring to FIGS. 2 and 3, the channel structure CS may further include a channel pad 150. The channel pad 150 may be disposed to be in contact with an upper portion of the semiconductor pattern 340. For example, the channel pad 150 may be disposed on a top surface of the filler insulation pattern 350 and a top surface of the semiconductor pattern 340, but is not limited thereto.

The channel pad 150 includes a conductive material. For example, the channel pad 150 may include polysilicon doped with impurities, but is not limited thereto.

First source structures 102 and 104 may be disposed on the cell substrate 100. The first source structures 102 and 104 may be interposed between the cell substrate 100 and the mold structures MS1 and MS2. The channel structure CS may pass or extend through the first source structures 102 and 104. For example, a lower portion of the channel structure CS may pass or extend through the first source structures 102 and 104 to be disposed in the cell substrate 100.

A source sacrificial layer 103 may be disposed on a part of the cell substrate 100. For example, the source sacrificial layer 103 may be disposed on a part of the cell substrate 100 in an extended region EXT.

Even though it is not illustrated, the vertical non-volatile memory device according to some embodiments may further include a block separation region which extends in the third direction (Z direction) to cut the mold structures MS1 and MS2. The block separation region may completely cut the mold structures MS1 and MS2. By doing this, the mold structures MS1 and MS2 may be divided by the block separation region to form a plurality of memory cell blocks.

A bit line BL may extend in the second direction (Y direction) on a second interlayer insulating layer 140*b*. Further, the bit line BL may extend in the second direction (Y direction) to be connected with a plurality of channel structures CS extended in the third direction (Z direction).

A bit line contact 182 which is connected with upper portions of the channel structures CS may be disposed in the second interlayer insulating layer 140*b*. The bit line BL may be electrically connected to the channel structures CS through the bit line contact 182.

The cell contact 162 may be connected with the word lines ECL, GSL, WL11 to WL1*n*, WL21 to WL2*n*, and SSL. For example, the cell contact 162 may extend in the interlayer insulating layer 140*a* and 140*b* in the third direction (Z direction) to be connected to each word line ECL, GSL, WL11 to WL1*n*, WL21 to WL2*n*, and SSL. In some embodiments, the cell contact 162 may have a bent portion between the first mold structure MS1 and the second mold structure MS2.

The source contact 164 may be connected to the first source structures 102 and 104. For example, the source contact 164 may extend in the interlayer insulating layers 140*a* and 140*b* in the third direction (Z direction) to be connected to the cell substrate 100. In some embodiments, the source contact 164 may have a bent portion between the first mold structure MS1 and the second mold structure MS2.

The cell contact 162 and the source contact 164 may be connected to a first wire structure 180 on the interlayer insulating layer 140*b*. For example, the first inter-wire insulation layer 142 may be disposed on the second interlayer insulating layer 140*b*. The first wire structure 180 may be disposed in the first inter-wire insulation layer 142. The cell contact 162 and the source contact 164 may be coupled to the first wire structure 180 by a contact via 184.

A peripheral circuit region PERI may include a peripheral circuit substrate 200, a peripheral circuit element PT, and a second wire structure 260.

The peripheral circuit substrate 200 may be disposed below the cell substrate 100. For example, a top surface of the peripheral circuit substrate 200 may be opposite to a bottom surface of the cell substrate 100. For example, the peripheral circuit substrate 200 may include a semiconductor substrate such as a silicon substrate, a germanium substrate, or a silicon-germanium substrate. Alternatively, the peripheral circuit substrate 200 may include a silicon-on-insulator (SOI) substrate or a germanium-on-insulator (GOI) substrate.

The peripheral circuit element PT may be disposed on the peripheral circuit substrate 200. The peripheral circuit element PT may configure a peripheral circuit which controls an operation of the semiconductor memory device. For example, the peripheral circuit element PT may include a control logic, a row decoder, and a page buffer. In the following description, a surface of the peripheral circuit substrate 200 on which the peripheral circuit element PT is disposed may be referred to as a front surface (front side) of the peripheral circuit substrate 200. In contrast, a surface of the peripheral circuit substrate 200 which is opposite to the front surface of the peripheral circuit substrate 200 is referred to as a back surface (back side) of the peripheral circuit substrate 200.

For example, the peripheral circuit element PT may include a transistor, but is not limited thereto. For example, the peripheral circuit element PT may include not only various active elements such as a transistor, but also various passive elements such as a capacitor, a resistor, and an inductor.

A bottom surface of the cell substrate 100 may be opposite to the top surface of the peripheral circuit substrate 200. For example, a second inter-wire insulation layer 240 which covers or is on the peripheral circuit element PT may be disposed on the top surface of the peripheral circuit substrate 200. The cell substrate 100 may be laminated or stacked on a top surface of the second inter-wire insulation layer 240.

When the charge storage layer of a vertical non-volatile memory device continuously extends between the memory cell transistors, there is a problem in that charges may be lost in an extending direction (for example, the third direction (Z direction)) of the charge storage layer. Therefore, the coupling between adjacent memory cell transistors causes a reliability of the vertical non-volatile memory device to deteriorate.

However, the vertical non-volatile memory device according to example embodiments of the present disclosure may include charge storage layers 320 which are spaced apart from each other so as to correspond to the memory cell transistors MCT. Accordingly, the charges lost in the extending direction of the charge storage layer (for example, the third direction (Z direction)) may be improved and the coupling between the adjacent memory cell transistors may be improved to provide a vertical non-volatile memory device with an improved reliability.

Figure 5:
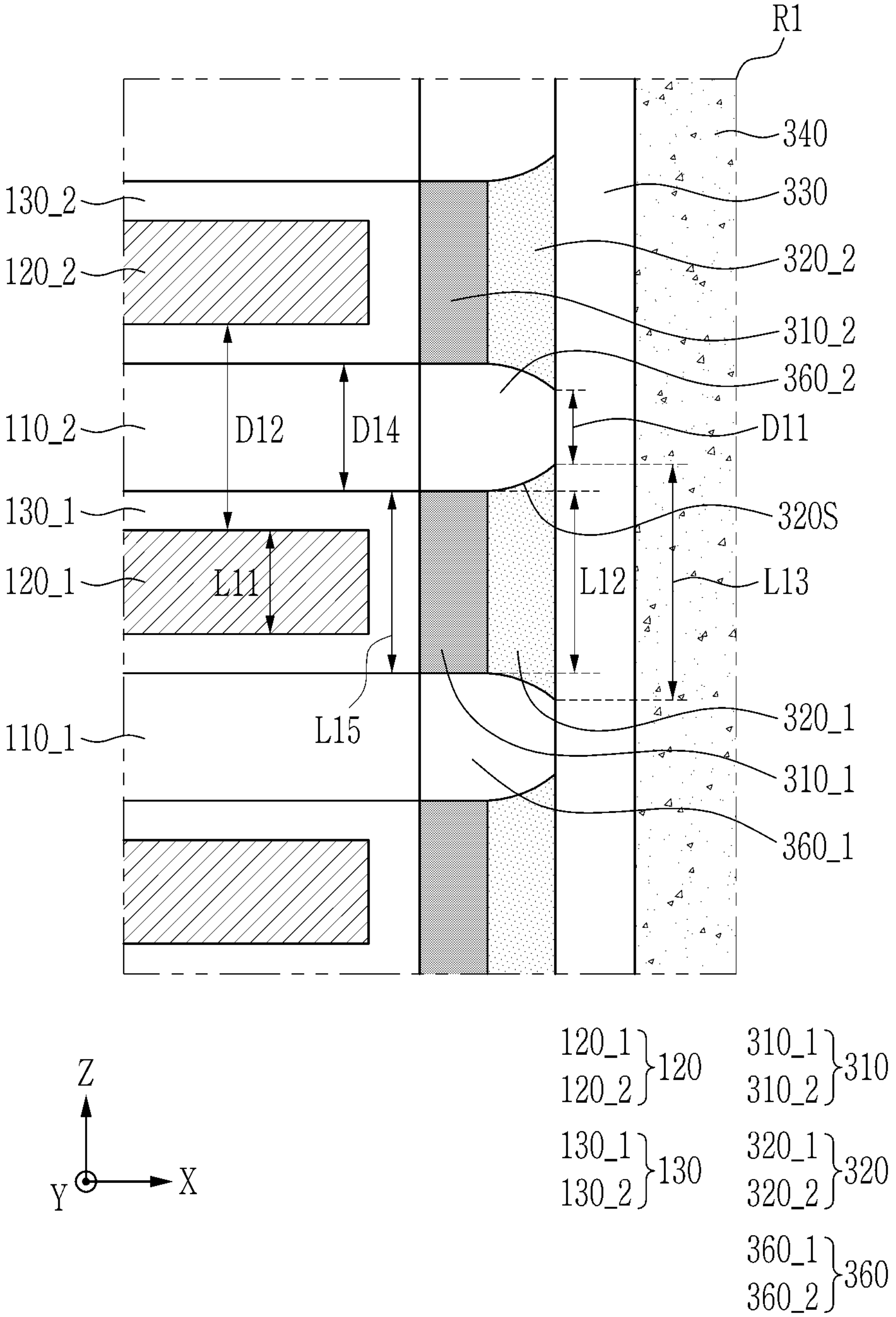
FIGS. 5 to 8 are cross-sectional views enlarging a region R1 of FIG. 2 according to some other embodiments.

FIG. 5 is a cross-sectional view enlarging a region R1 of FIG. 2 according to some other embodiments.

FIG. 5 is substantially equivalent to the embodiments of FIGS. 1 to 4 except for a shape of charge storage layers 320. Hereinafter, the difference from the embodiments of FIGS. 1 to 4 will be mainly described.

Referring to FIG. 5, the charge storage layers 320 may be disposed on a sidewall of the tunnel insulation layer 330. Accordingly, the tunnel insulation layer 330 may be interposed between the semiconductor pattern 340 and the charge storage layers 320. Further, each charge storage layer 320 may be located between the charge insulation layers 360, and each charge storage layer 320 may extend in the third direction (Z direction).

The charge storage layers 320 may be disposed to be spaced apart from each other along the third direction (Z direction). For example, as illustrated in FIG. 5, the first charge storage layer 320_1 and the second charge storage layer 320_2 may be disposed to be spaced apart from each other in the third direction (Z direction). Further, the first charge storage layer 320_1 may be interposed between the first charge insulation layer 360_1 and the second charge insulation layer 360_2. Accordingly, the first charge storage layer 320_1 and the second charge storage layer 320_2 may be spaced apart from each other by the second charge insulation layer 360_2. For example, the first charge storage layer 320_1 and the second charge storage layer 320_2 may be spaced apart from each other with the second charge insulation layer 360_2 therebetween. Accordingly, each charge storage layer 320 may be located between the charge insulation layers 360. For example, each charge storage layer 320 may be between adjacent ones of the charge insulation layers 360 in the third direction (Z direction).

In some embodiments, as illustrated in FIG. 5, a length of the charge storage layers 320 along the third direction (Z direction) may be increased as it is closer to the semiconductor pattern 340. For example, a length of the first charge storage layer 320_1 extending in the third direction (Z direction) may be increased as it is closer to the semiconductor pattern 340. For example, a length of the first charge storage layer 320_1 in the third direction (Z direction) may increase toward the semiconductor pattern 340. Accordingly, a second length L12 of a surface of the first charge storage layer 320_1 which is in contact with the first blocking insulation layer 310_1 may be shorter than a third length L13 of a surface of the first charge storage layer 320_1 which is opposite to the semiconductor pattern 340. Further, the charge storage layers 320 overlapping the gate electrodes 120 in the first direction (X direction) may have a uniform thickness along the first direction (X direction). For example, the charge storage layers 320 may overlap the gate electrodes 120 in the first direction (X direction), and portions of the charge storage layers 320 that overlap the gate electrodes 120 in the first direction (X direction) may have uniform thicknesses along the first direction (X direction). For example, the first charge storage layer 320_1 overlapping the first gate electrode 120_1 in the first direction (X direction) may have a uniform thickness along the first direction (X direction), and the second charge storage layer 320_2 overlapping the second gate electrode 120_2 in the first direction (X direction) may have a uniform thickness along the first direction (X direction).

The second length L12 of the first charge storage layer 320_1 may be longer than the first length L11 of the first gate electrode 120_1 along the third direction (Z direction). Accordingly, a distance between the charge storage layers 320 may be shorter than a distance between the barrier layers 130. For example, a first distance D11 between the first charge storage layer 320_1 and the second charge storage layer 320_2 may be shorter than a fourth distance D14 between the first barrier layer 130_1 and the second barrier layer 130_2 which are adjacent to each other.

In some embodiments, a surface of the charge storage layers 320 which is in contact with the charge insulation layer 360 may include a concave surface. That is, a cross-section of each of the charge storage layers 320 may have a rounded shape. For example, a surface of the charge storage layers 320 that is in contact with the charge insulation layer 360 may have a concave shape. For example, a surface of the first charge storage layer 320_1 which is in contact with the second charge insulation layer 360_2 may have a first concave surface 320S shape.

The vertical non-volatile memory device according to example embodiments of the present disclosure may include charge storage layers 320 which are spaced apart from each other so that charges lost in the extending direction of the charge storage layer (for example, the third direction (Z direction)) are improved and the coupling between adjacent memory cell transistors is improved to provide a vertical non-volatile memory device with an improved reliability.

Figure 6:
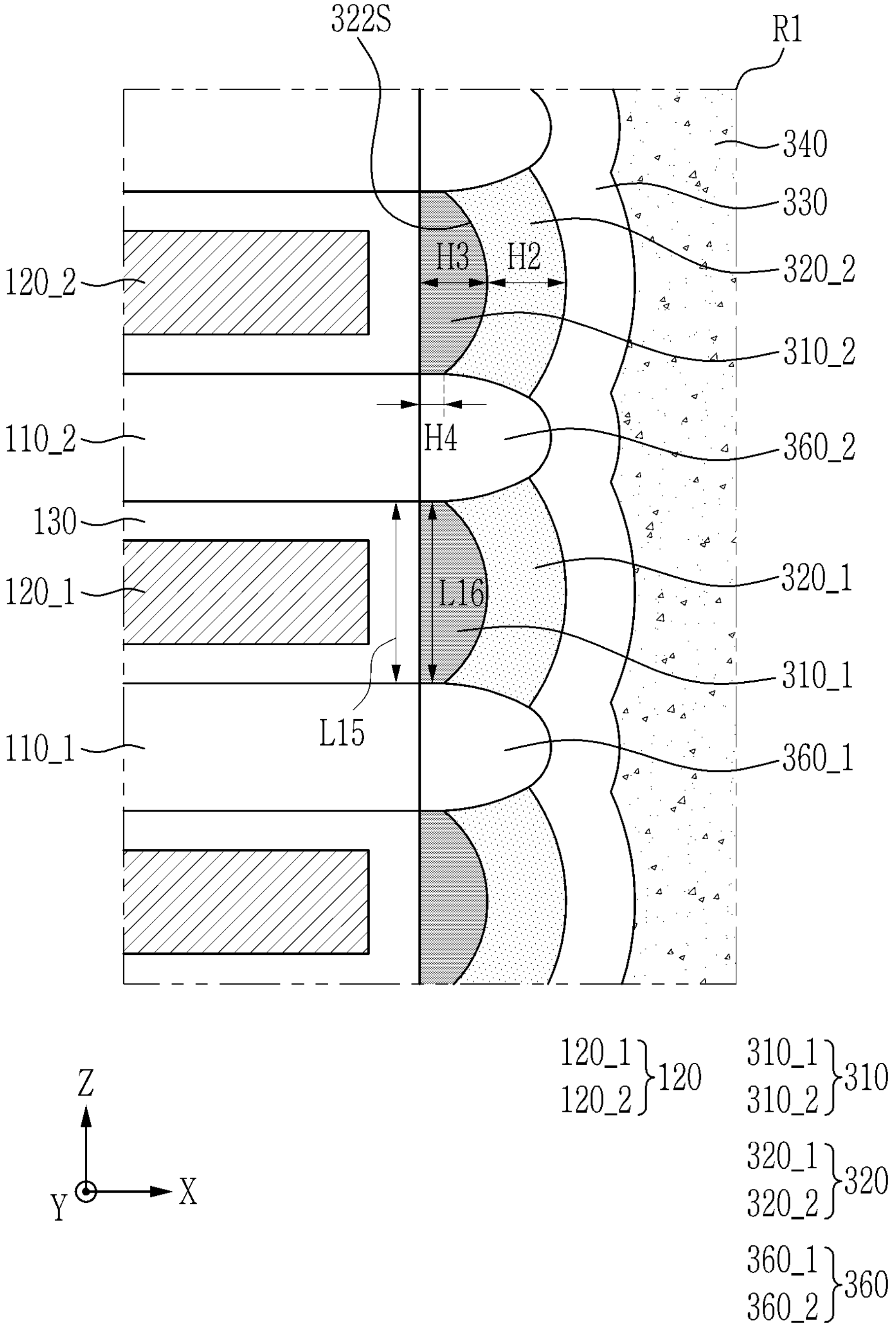

FIG. 6 is a cross-sectional view enlarging a region R1 of FIG. 2 according to some other embodiments.

Referring to FIG. 6, in a vertical non-volatile memory device according to some embodiments, each charge storage layer 320 may include a second concave surface 322S.

A thickness of each charge storage layer 320 along the first direction (X direction) may be uniform. For example, the first charge storage layer 320_1 overlapping the first gate electrode 120_1 in the first direction (X direction) may have a uniform thickness along the first direction (X direction). Further, a second thickness H2 along the first direction (X direction) of the second charge storage layer 320_2 overlapping the second gate electrode 120_2 in the first direction (X direction) may be uniform.

A second concave surface 322S of each charge storage layer 320 may be disposed on each blocking insulation layer 310. For example, the second concave surface 322S may be disposed on an outer surface of each of the blocking insulation layers 310.

Each blocking insulation layer 310 may have a complementary shape with the second concave surface 322S. For example, each blocking insulation layers 310 may have a shape of a convex surface corresponding to the second concave surface 322S. For example, a surface of each of the blocking insulation layers 310 that is in contact with the second concave surface 322S may have a convex shape. By doing this, the thickness of the blocking insulation layers 310 along the first direction (X direction) may be reduced as it is closer to the charge insulation layer 360. For example, a thickness of the blocking insulation layers 310 in the first direction (X direction) may decrease toward the charge insulation layer 360. For example, a third thickness H3 at a center of the second blocking insulation layer 310_2 along the first direction (X direction) may be larger than a fourth thickness H4 of the second blocking insulation layer 310_2 which is in contact with the charge insulation layer 360_2. Here, the thickness refers to a thickness in the first direction (X direction).

The tunnel insulation layer 330 may be disposed to be adjacent to the charge storage layers 320 and the charge insulation layer 360 in the first direction (X direction). For example, the tunnel insulation layer 330 may be disposed along a profile of the charge storage layers 320 and the charge insulation layer 360. Further, a thickness of the tunnel insulation layer 330 along the first direction (X direction) may be uniform. Accordingly, the semiconductor pattern 340 may also be disposed along the profile of the tunnel insulation layer 330.

Figure 7:
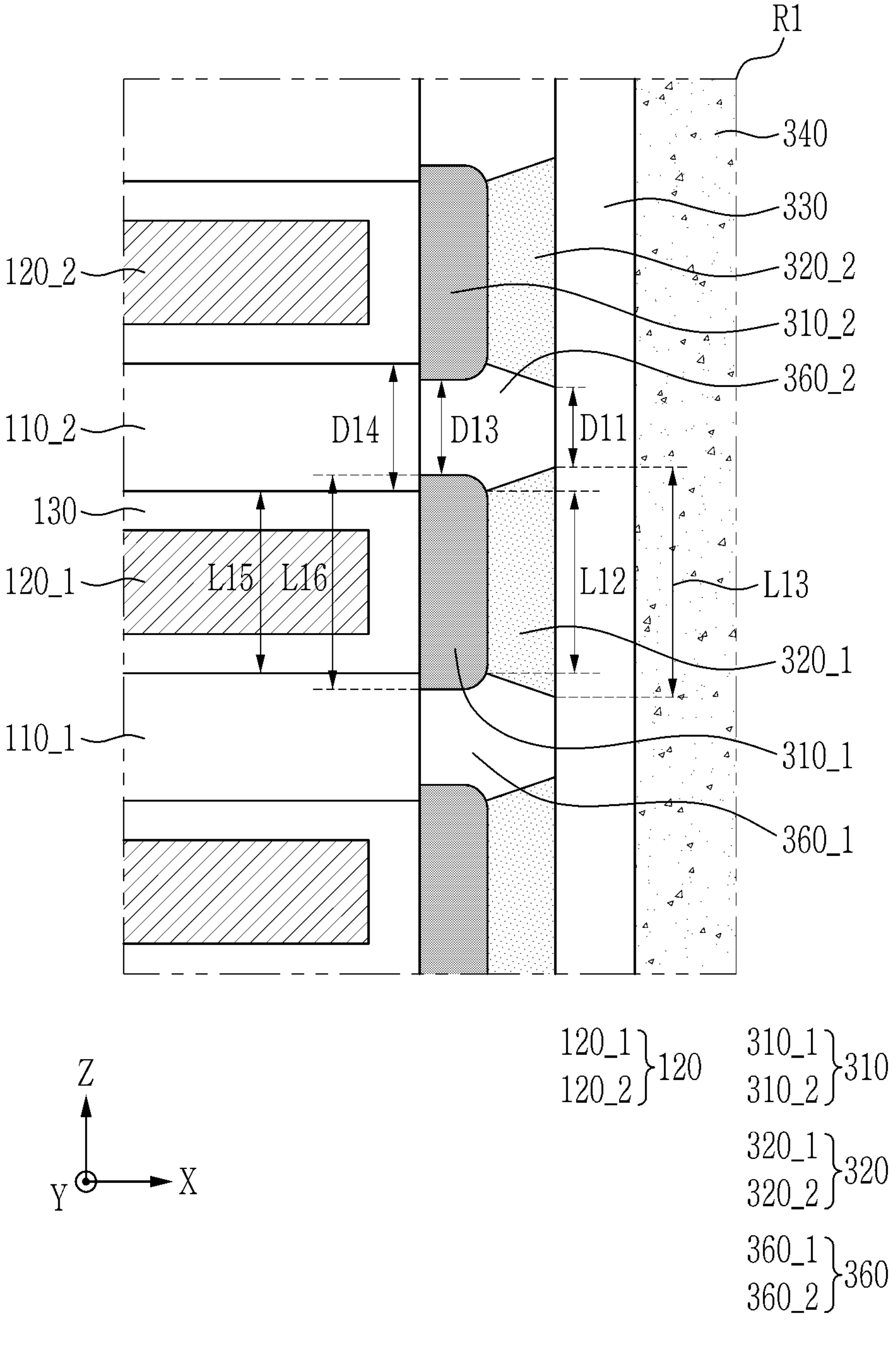

FIG. 7 is a cross-sectional view enlarging a region R1 of FIG. 2 according to some other embodiments.

Referring to FIG. 7, the blocking insulation layers 310 may be disposed on a sidewall of the charge storage layers 320. Accordingly, the charge storage layers 320 may be interposed between the tunnel insulation layer 330 and the blocking insulation layers 310. Further, the blocking insulation layers 310 may be located between the charge insulation layers 360, and each blocking insulation layer 310 may extend in the third direction (Z direction).

Each blocking insulation layer 310 may be interposed between corresponding charge storage layer 320 and corresponding one of the word lines ECL, GSL, WL11 to WL1*n*, WL21 to WL2*n*, and SSL. Further, the blocking insulation layers 310 may be disposed to be spaced apart from each other along the third direction (Z direction), and the blocking insulation layers 310 may be located between the charge insulation layers 360. For example, each blocking insulation layer 310 may be between adjacent ones of the charge insulation layers 360 in the third direction (Z direction).

In some embodiments, each blocking insulation layer 310 may extend in the third direction (Z direction) to be longer than each barrier layer 130. For example, a sixth length L16 of the first blocking insulation layer 310_1 along the third direction (Z direction) may be longer than a fifth length L15 of the barrier layer 130. The description thereof is substantially equivalent to the embodiments of FIGS. 1 to 4 so further description will be omitted.

As illustrated in FIG. 7, a sixth length L16 of the first blocking insulation layer 310_1 along the third direction (Z direction) may be longer than the second length L12 of the first charge storage layer 320_1. However, also in this case, the sixth length L16 of the first blocking insulation layer 310_1 may be shorter than the third length L13 of the first charge storage layer 320_1.

The vertical non-volatile memory device according to example embodiments of the present disclosure may also include charge storage layers 320 which are spaced apart from each other so that the charges lost in the extending direction of the charge storage layer (for example, third direction (Z direction)) are improved and the coupling between the adjacent memory cell transistors is improved to provide a vertical non-volatile memory device with an improved reliability.

Figure 8:
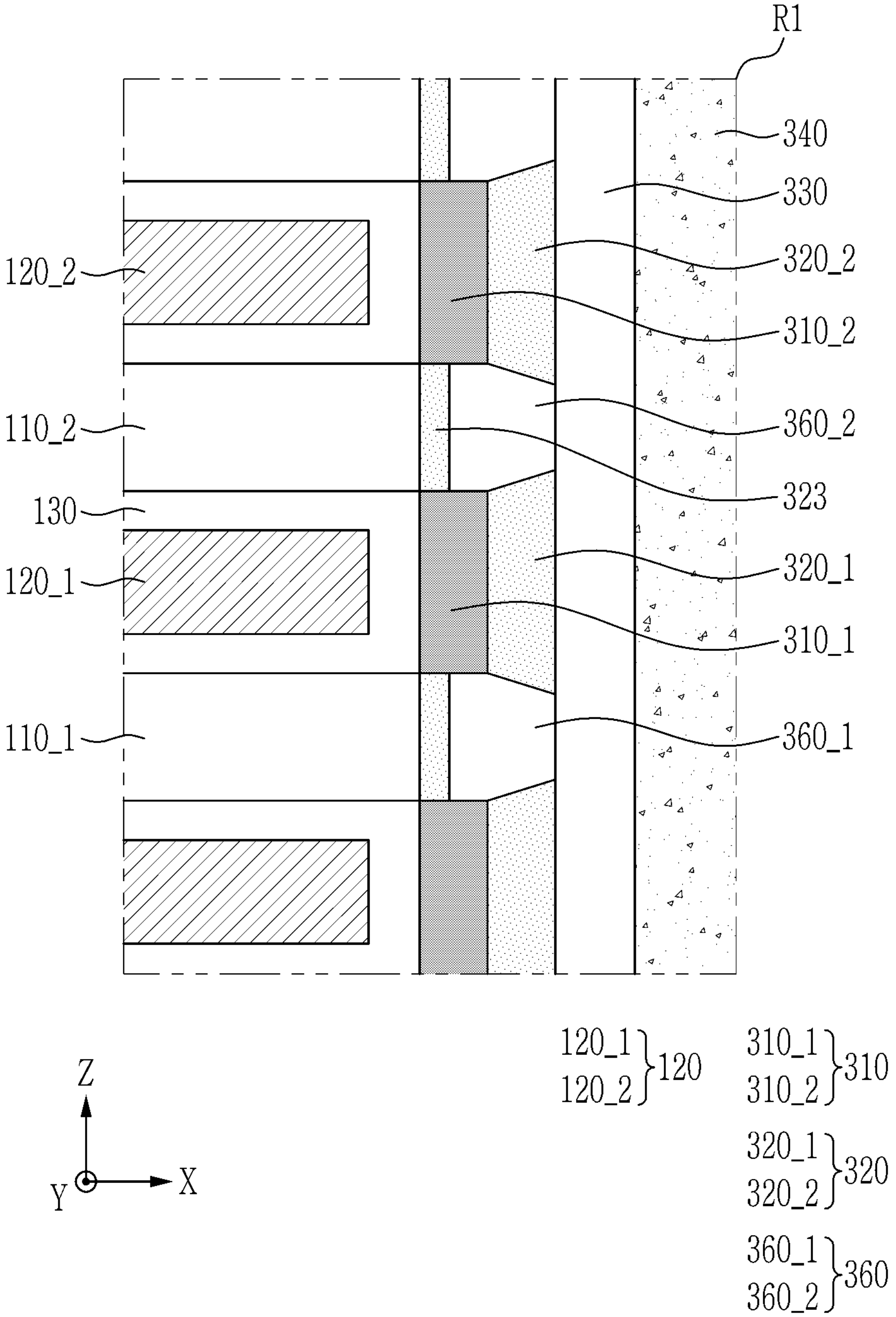

FIG. 8 is a cross-sectional view enlarging a region R1 of FIG. 2 according to some other embodiments.

Referring to FIG. 8, the blocking insulation layers 310 may be disposed on a sidewall of the charge storage layers 320. Accordingly, the charge storage layers 320 may be interposed between the tunnel insulation layer 330 and the blocking insulation layers 310. Further, the blocking insulation layers 310 may be located between the charge insulation layers 360, and each blocking insulation layer 310 may extend in the third direction (Z direction).

Each blocking insulation layer 310 may be interposed between corresponding charge storage layer 320 and corresponding one of the word lines ECL, GSL, WL11 to WL1*n*, WL21 to WL2*n*, and SSL. Further, the blocking insulation layers 310 may be disposed to be spaced apart from each other along the third direction (Z direction), and the blocking insulation layers 310 may be located between the charge insulation layers 360. For example, each blocking insulation layer 310 may be between adjacent ones of the charge insulation layers 360 in the third direction (Z direction).

In some embodiments, a dummy charge storage layer 323 may be located between the blocking insulation layers 310. For example, the dummy charge storage layer 323 may be located between the first blocking insulation layer 310_1 and the second blocking insulation layer 310_2. Further, the dummy charge storage layer 323 may extend along the third direction (Z direction). For example, the dummy charge storage layer 323 may extend along the third direction (Z direction) to be in contact with the first blocking insulation layer 310_1 and the second blocking insulation layer 310_2. Further, the dummy charge storage layer 323 may be located between the insulation patterns 110 and the charge insulation layer 360. Further, the dummy charge storage layer 323 may be in contact with the insulation patterns 110. That is, at least a part of the dummy charge storage layer 323 may be enclosed or at least partially surrounded by the blocking insulation layers 310 and the other part of the dummy charge storage layer 323 may be enclosed or at least partially surrounded by the charge insulation layer 360 and/or the insulation patterns 110. For example, the dummy charge storage layer 323 may be disposed on the second insulation pattern 110_2 and may be enclosed or at least partially surrounded by the second insulation pattern 110_2, the first blocking insulation layer 310_1, the second blocking insulation layer 310_2, and the second charge insulation layer 360_2.

The dummy charge storage layer 323 may be formed by a part of material for forming the charge storage layers 320 which remains on the insulation patterns 110_1 and 110_2 during the process of forming the charge storage layers 320.

A thickness of the dummy charge storage layer 323 along the first direction (X direction) may be uniform. Further, the thickness of the dummy charge storage layer 323 along the first direction (X direction) may be smaller than a thickness of each of the charge storage layers 320 along the first direction (X direction). The dummy charge storage layers 323 may be symmetrical to each other along the third direction (Z direction) with respect to a center of each insulation pattern 110, but are not limited thereto.

Even though FIG. 8 illustrates that the dummy charge storage layer 323 extends along the third direction (Z direction) and is in contact with the first blocking insulation layer 310_1 and the second blocking insulation layer 310_2, the present disclosure is not limited thereto. For example, the dummy charge storage layer 323 may further extend in the first direction (X direction) along one surface of the blocking insulation layers 310. Alternatively, the dummy charge storage layer 323 may not be in contact with the blocking insulation layers 310.

The vertical non-volatile memory device according to example embodiments of the present disclosure may also include charge storage layers 320 which are spaced apart from each other so that the charges lost in the extending direction of the charge storage layer (for example, third direction (Z direction)) are improved and the coupling between the adjacent memory cell transistors is improved to provide a vertical non-volatile memory device with an improved reliability.

Hereinafter a method for manufacturing a vertical non-volatile memory device according to some embodiments will be described with reference to FIGS. 9 to 21 as follows.

Figure 13:
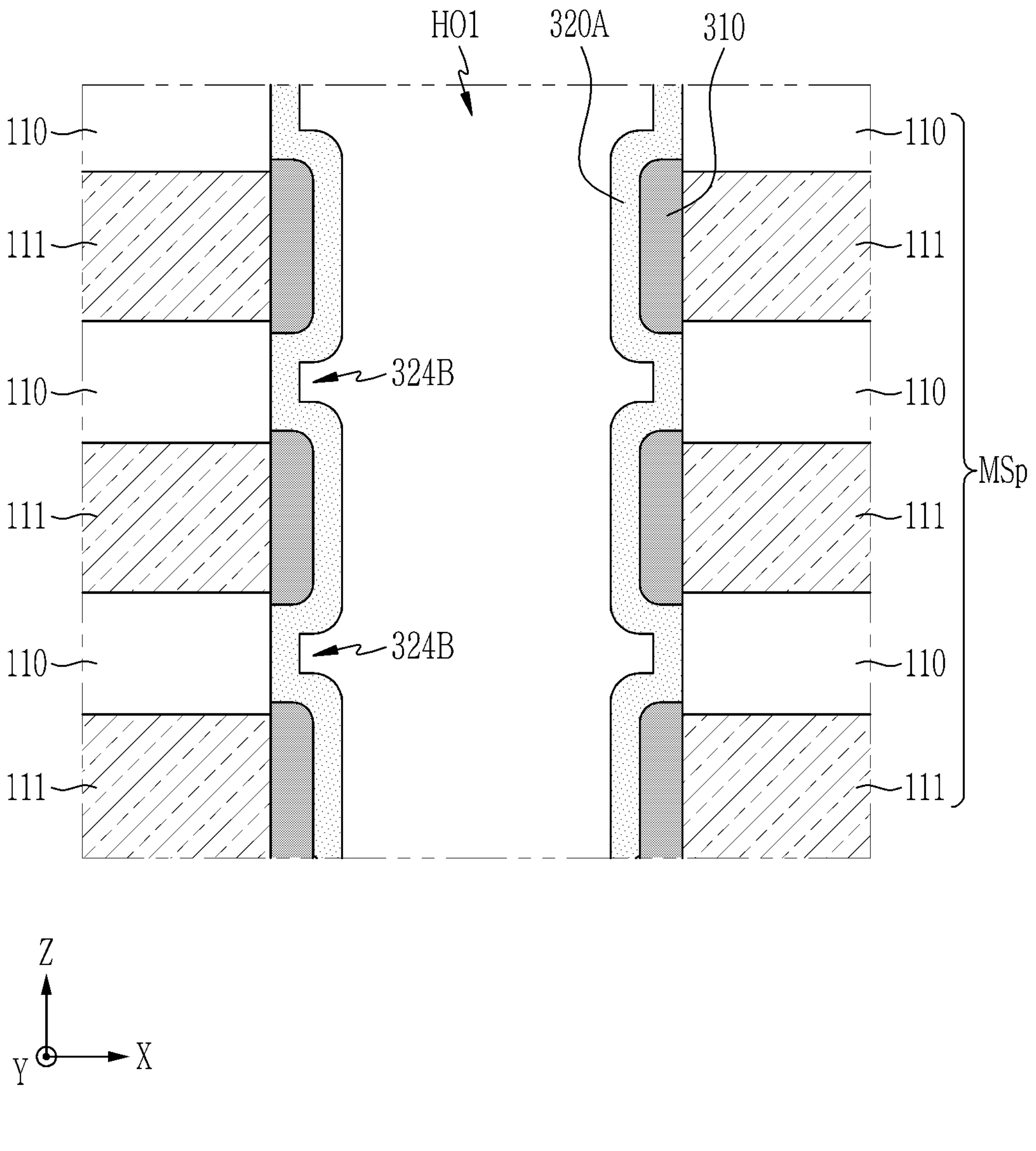
Figure 14:
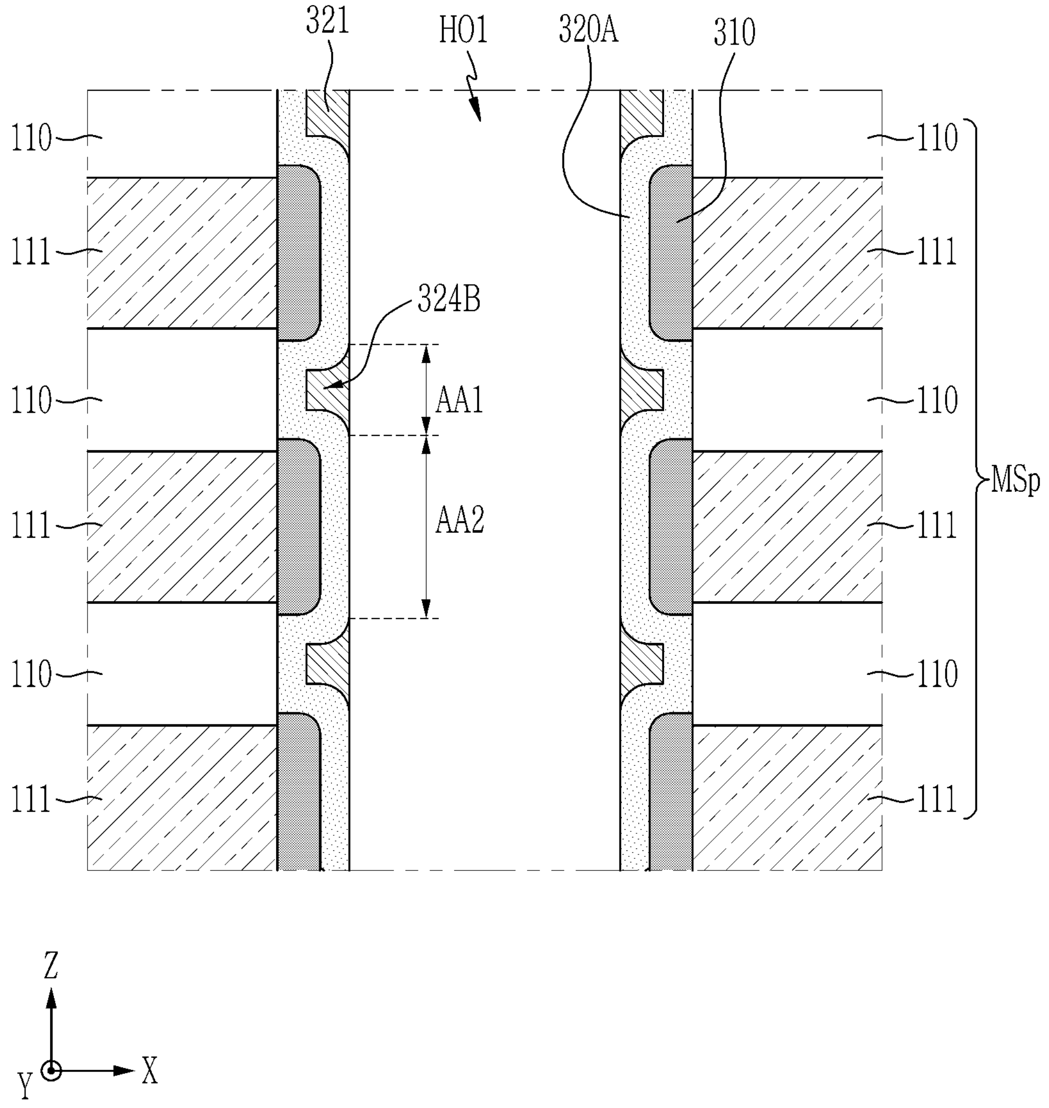
Figure 15:
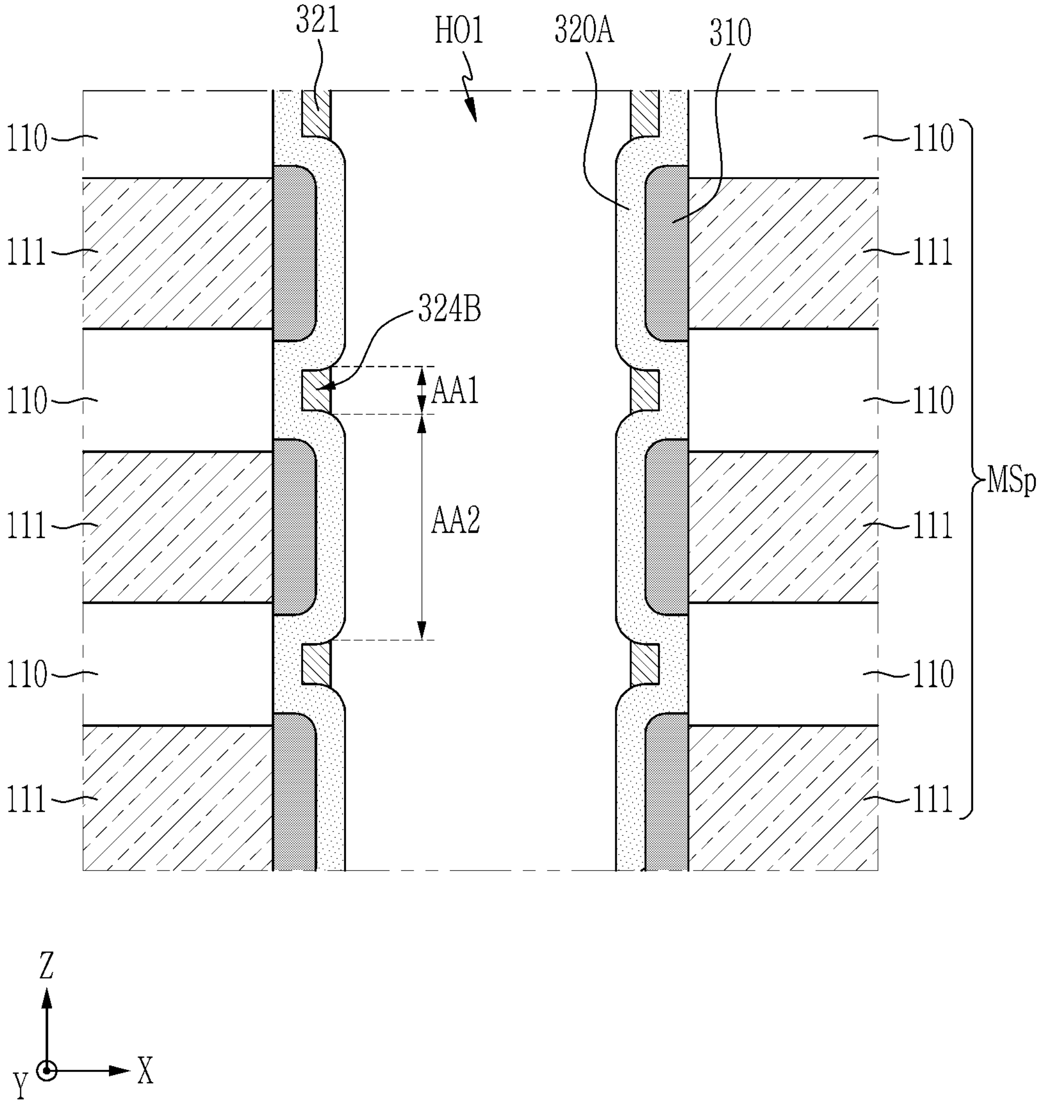
FIG. 15 is a process cross-sectional view illustrating a blocking pattern of a vertical non-volatile memory device according to some embodiments.

FIGS. 9 to 14 and FIGS. 16 to 21 are process cross-sectional views sequentially illustrating a manufacturing method of a vertical non-volatile memory device according to some embodiments, and FIG. 15 is a process cross-sectional view illustrating a blocking pattern of a vertical non-volatile memory device according to some other embodiments. For better understanding and ease of description, repeated parts with the description using FIGS. 1 to 8 may be briefly described or omitted.

Figure 9:
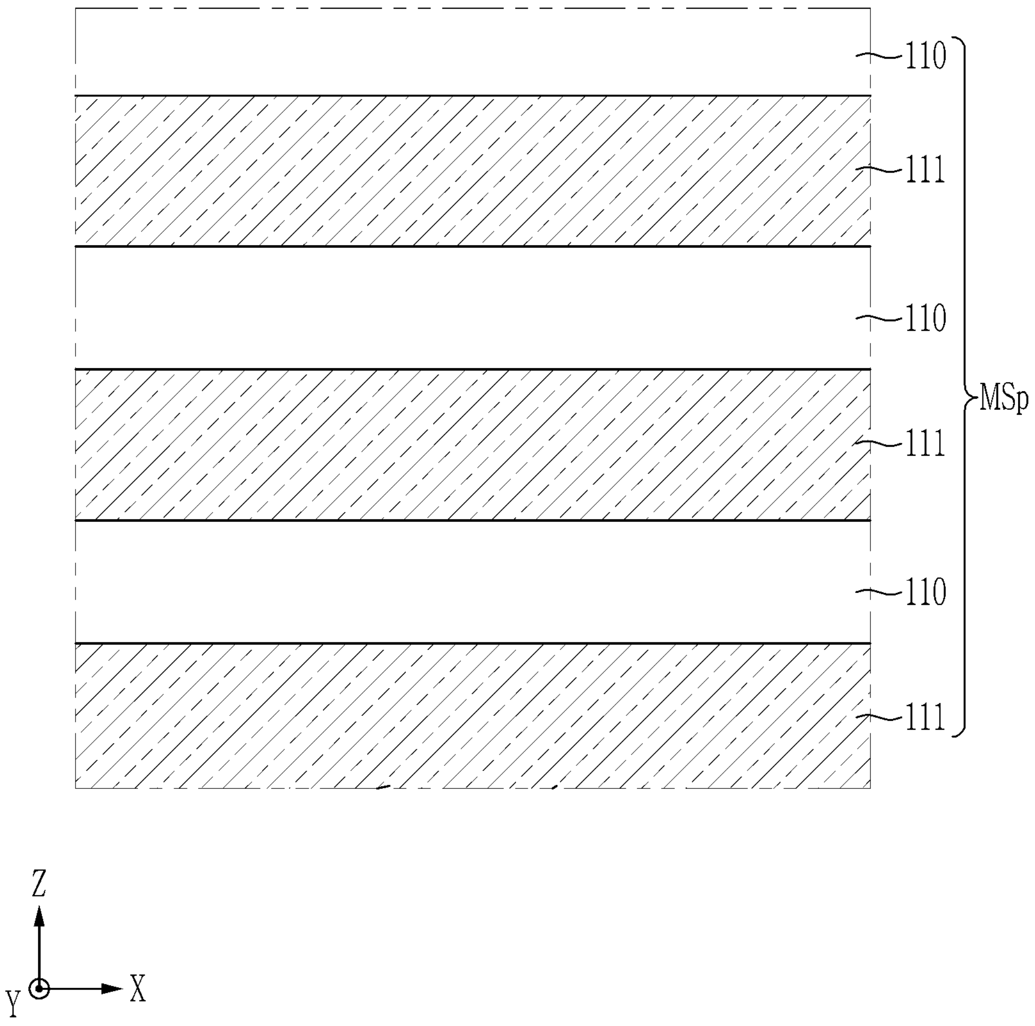
FIGS. 9 to 14 and FIGS. 16 to 21 are process cross-sectional views sequentially illustrating a manufacturing method of a vertical non-volatile memory device according to some embodiments.

First, as illustrated in FIG. 9, insulation patterns 110 and sacrificial layers 111 may be alternately laminated or stacked on the cell substrate. For example, insulation patterns 110 may be formed on the cell substrate first, and then a sacrificial layer 111 may be formed on the insulation patterns 110. Next, insulation patterns 110 may be formed on the sacrificial layer 111, and the sacrificial layer 111 may be formed on the insulation patterns 110. This process may be repeatedly performed to form a preliminary mold structure MSp in which a plurality of insulation patterns 110 and a plurality of sacrificial layers 111 are alternately laminated or stacked.

Even though it is illustrated that the sacrificial layers 111 have the same thickness for better understanding and ease of description, the present disclosure is not limited thereto. For example, a lowermost sacrificial layer 111 may have a thickness different from that of the other sacrificial layers 111. For example, the sacrificial layer 111 may include at least one of silicon nitride, silicon oxy nitride, silicon rich nitride (Si-rich nitride) or nanocrystalline silicon (nanocrystalline Si). For better understanding and ease of description, hereinafter, it is described that the sacrificial layer 111 includes silicon nitride. The sacrificial layer 111 may define a region in which the above-described word lines ECL, GSL, WL11 to WL1*n*, WL21 to WL2*n*, and SSL are formed.

Figure 10:
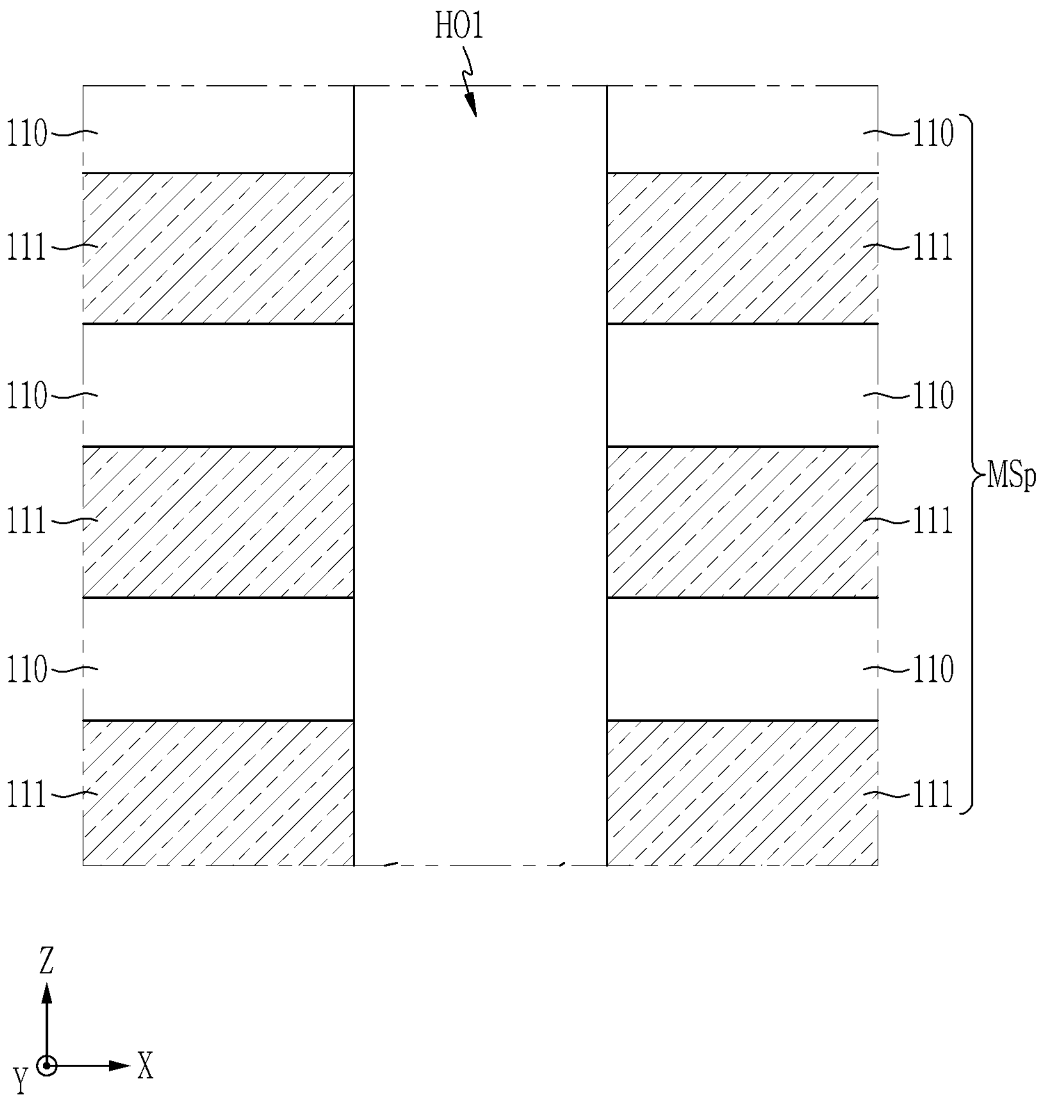

Referring to FIG. 10, a first hole HO1 may be formed in the preliminary mold structure MSp.

For example, the first hole HO1 which passes or extends through the sacrificial layer 111 may be formed by etching a part of the preliminary mold structure MSp. In some embodiments, the first hole HO1 may be formed to pass or extend through the preliminary mold structure MSp to expose a part of the cell substrate 100 (e.g., see FIG. 2).

The first hole HO1 may include a predetermined width and the width of the first hole HO1 may be uniform. A width of a lower portion of the first hole HO1 may be substantially equivalent to a width of an upper portion. That is, the width may be uniform regardless of a depth of the first hole HO1. Alternatively, as another example, the first hole HO1 may have a tapered shape. That is, the closer to the cell substrate 100, the smaller the width of the first hole HO1. A shape of the first hole HO1 may be caused by a characteristic of an etching process for forming the first hole HO1, but is not limited thereto.

Figure 11:
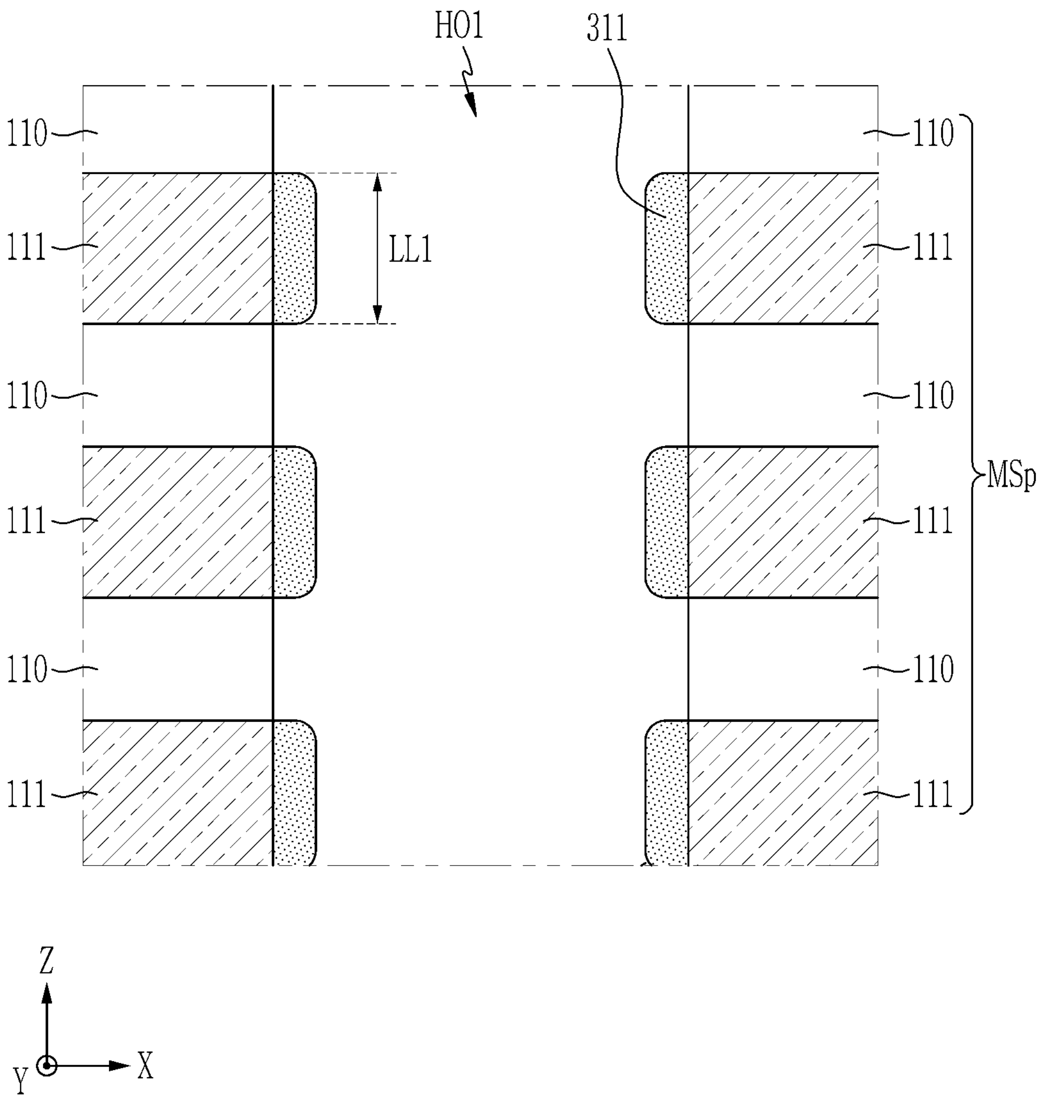

Referring to FIG. 11, a seed insulating layers 311 which selectively cover or are on only the sacrificial layer 111 may be formed in the first hole HO1. The seed insulation layers 311 may be formed to be separated from each other with a first width LL1 along the third direction (Z direction). For example, the seed insulation layers 311 may be formed on the sacrificial layer 111 using an area selective deposition (ASD) process. The area selective deposition process may be performed using a material which has no or relatively very small (low) chemical affinity with the surfaces of the insulation patterns 110 and has relatively large (high) chemical affinity with the surfaces of the sacrificial layer 111.

The seed insulation layers 311 may include silicon nitride, silicon oxide, or polysilicon. For example, the seed insulation layers 311 may form silicon nitride using a silicon source material and $NH_3$ gas. Here, the silicon source material may include $SiH_4$, HCDS ($Si_2Cl_6$), DCS ($SiH_2Cl_2$), tris(dimethylamino) silane (TDMAS), bis(diethylamino) silane (BDEAS), and bis(tertiarybutylamino) silane (BTBAS). Hereinafter, an example in which the seed insulation layers 311 are formed of silicon nitride will be described.

When the seed insulation layers 311 are formed using the area selective deposition process, first, a plasma native oxide cleaning or pre native oxide cleaning (PNC) process may be performed first on the surfaces of the sacrificial layer 111 and the insulation patterns 110 which are alternately laminated or stacked. A selective deposition process may be performed after the PNC process to smoothly form the seed insulation layers 311 on a surface of the sacrificial layer 111.

Figure 12:
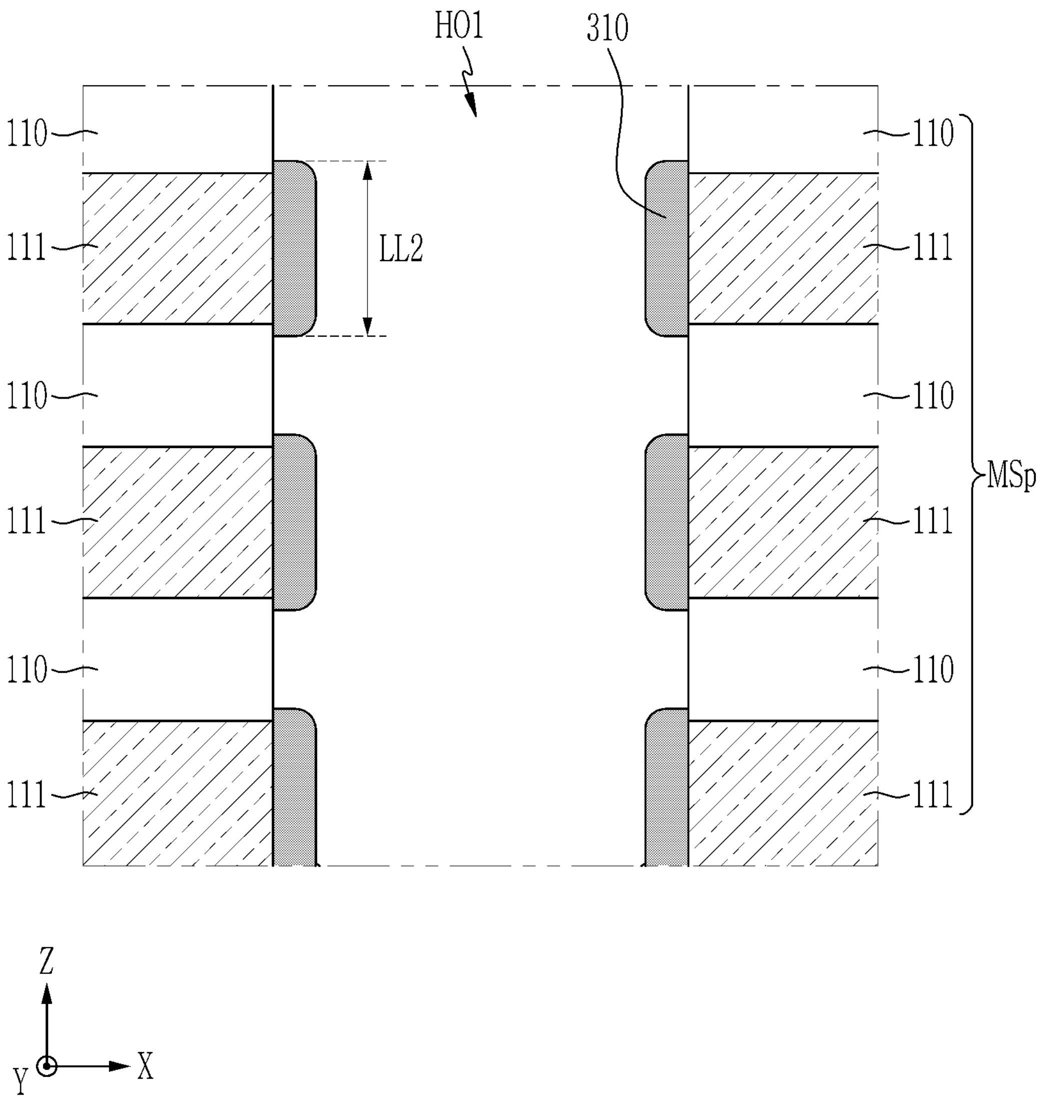

Referring to FIG. 12, the seed insulation layers 311 may be oxidized to form the blocking insulation layers 310. For example, an oxidation process may be performed on the seed insulating layers 311 including silicon nitride to form the blocking insulation layers 310 formed of silicon oxide. For example, the oxidation process may use $H_2/O_2$ mixed gas. However, the forming method of the blocking insulation layers 310 is not limited thereto and the blocking insulation layers 310 may be formed by another method.

For example, the blocking insulation layers 310 may include at least one of silicon oxide, silicon oxynitride, aluminum oxide, or hafnium oxide. Hereinafter, an example in which the blocking insulation layers 310 are formed of silicon oxide will be described.

During a process of forming the blocking insulation layers 310 by oxidizing the seed insulation layers 311, sizes of the blocking insulation layers 310 may be increased. The oxidation process may be performed on each of the seed insulation layers 311 so that a volume is increased during a process of forming the seed insulation layers 311 to the blocking insulation layers 310.

Accordingly, a second width LL2 of each blocking insulation layer 310 along the third direction may be larger than a first width LL1 of the seed insulation layers 311 along the third direction. Accordingly, each blocking insulation layer 310 may be formed not only on the sacrificial layer 111, but also on the insulation patterns 110. However, as illustrated in FIG. 12, the blocking insulation layers 310 may be formed to be spaced apart from each other along the third direction (Z direction).

When the blocking insulation layers 310 is formed using the oxidation process after forming the seed insulation layers 311 formed of silicon nitride first according to some embodiments, the back tunneling prevention characteristic may be excellent.

Referring to FIG. 13, a preliminary charge storage layer 320A may be formed on the blocking insulation layers 310 and the insulation patterns 110. For example, the preliminary charge storage layer 320A may be formed on an inner surface of the first hole HO1 along the profile of the blocking insulation layers 310 and the insulation patterns 110. The preliminary charge storage layer 320A may be formed using the chemical vapor deposition (CVD) method or the atomic layer deposition (ALD) method.

The preliminary charge storage layer 320A may be formed on the blocking insulation layers 310 so that a recessed portion 324B may be included. For example, the blocking insulation layers 310 may be selectively formed on the sacrificial layers 111 so that the blocking insulation layers 310 may protrude or extend from a boundary of the first hole HO1. Accordingly, the preliminary charge storage layer 320A may be formed on the protruding blocking insulation layers 310 and the insulation patterns 110 so that a recessed portion 324B which is recessed in the first direction (X direction) in a partial region of the preliminary charge storage layer 320A which overlaps the insulation patterns 110 in first direction (X direction) is included.

Referring to FIGS. 14 and 15, a blocking pattern 321 may be formed on a first region AA1 of the preliminary charge storage layer 320A. For example, a blocking pattern 321 may be formed on the preliminary charge storage layer 320A in a first region AA1.

Referring to FIG. 14, the blocking pattern 321 may be formed in the recessed portion 324B of the preliminary charge storage layer 320A. As described above, the recessed portion 324B may be included in a partial region of the preliminary charge storage layer 320A which overlaps the insulation patterns 110 in the first direction (X direction). For example, the first region AA1 may overlap the insulation patterns 110 in the first direction (X direction). For example, the recessed portion 324B may be included in the first region AA1. The blocking pattern 321 may be formed on the recessed portion 324B.

The blocking pattern 321 may be filled in the recessed portion 324B of the preliminary charge storage layer 320A. For example, as illustrated in FIG. 14, the blocking pattern 321 may be formed in the first region AA1 of the preliminary charge storage layer 320A, but may not be formed in a second region AA2. Accordingly, the blocking pattern 321 may be interposed in the recessed portion 324B of the preliminary charge storage layer 320A so that a first region AA1 in which the blocking pattern 321 is exposed and a second region AA2 in which the preliminary charge storage layer 320A is exposed may be included. Alternatively, as illustrated in FIG. 15, the blocking pattern 321 may be filled only in a partial region of the recessed portion 324B. For example, the blocking pattern 321 may only partially fill the recessed portion 324B. That is, the first region AA1 in which the blocking pattern 321 is formed may be a partial region of the recessed portion 324B.

Figure 16:
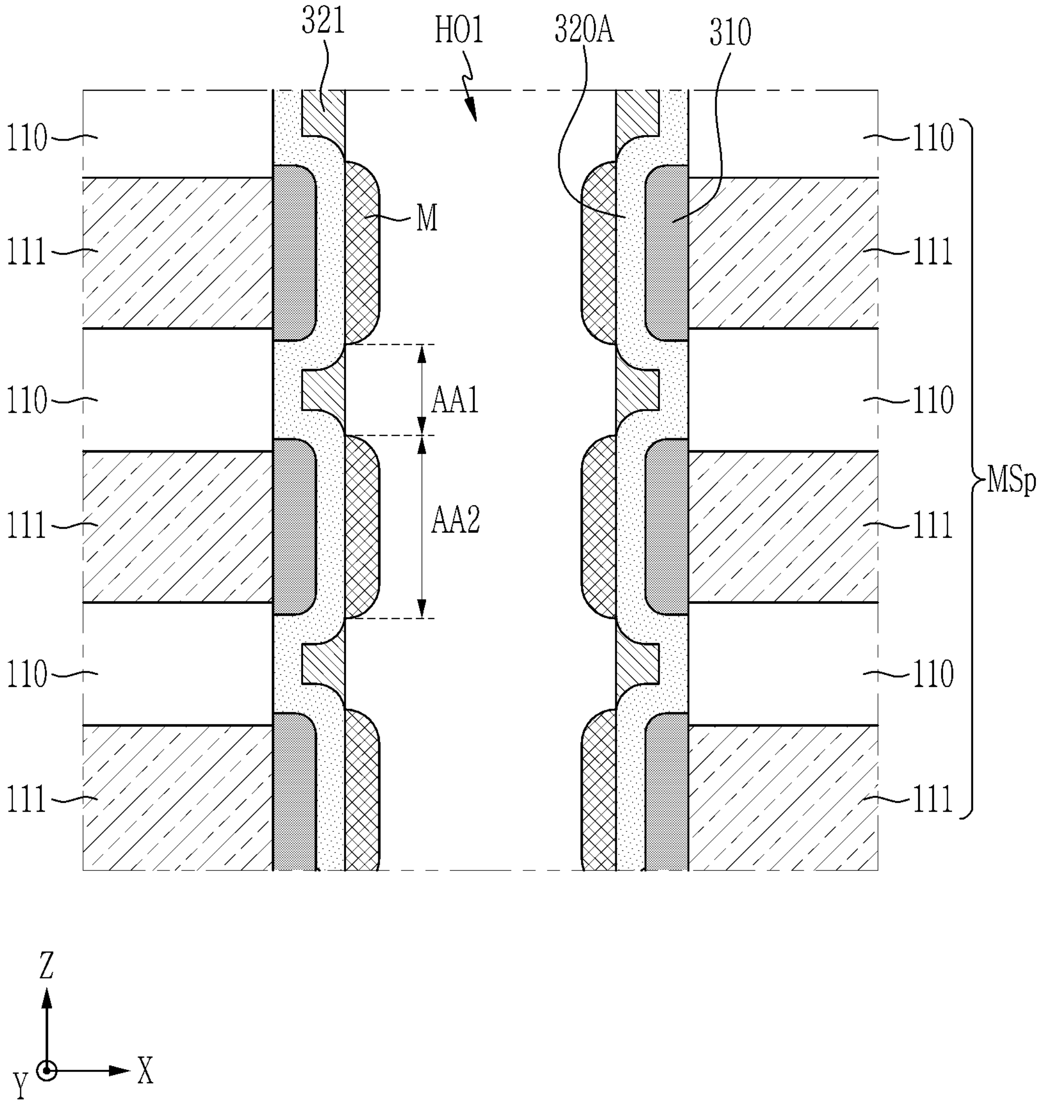
Figure 17:
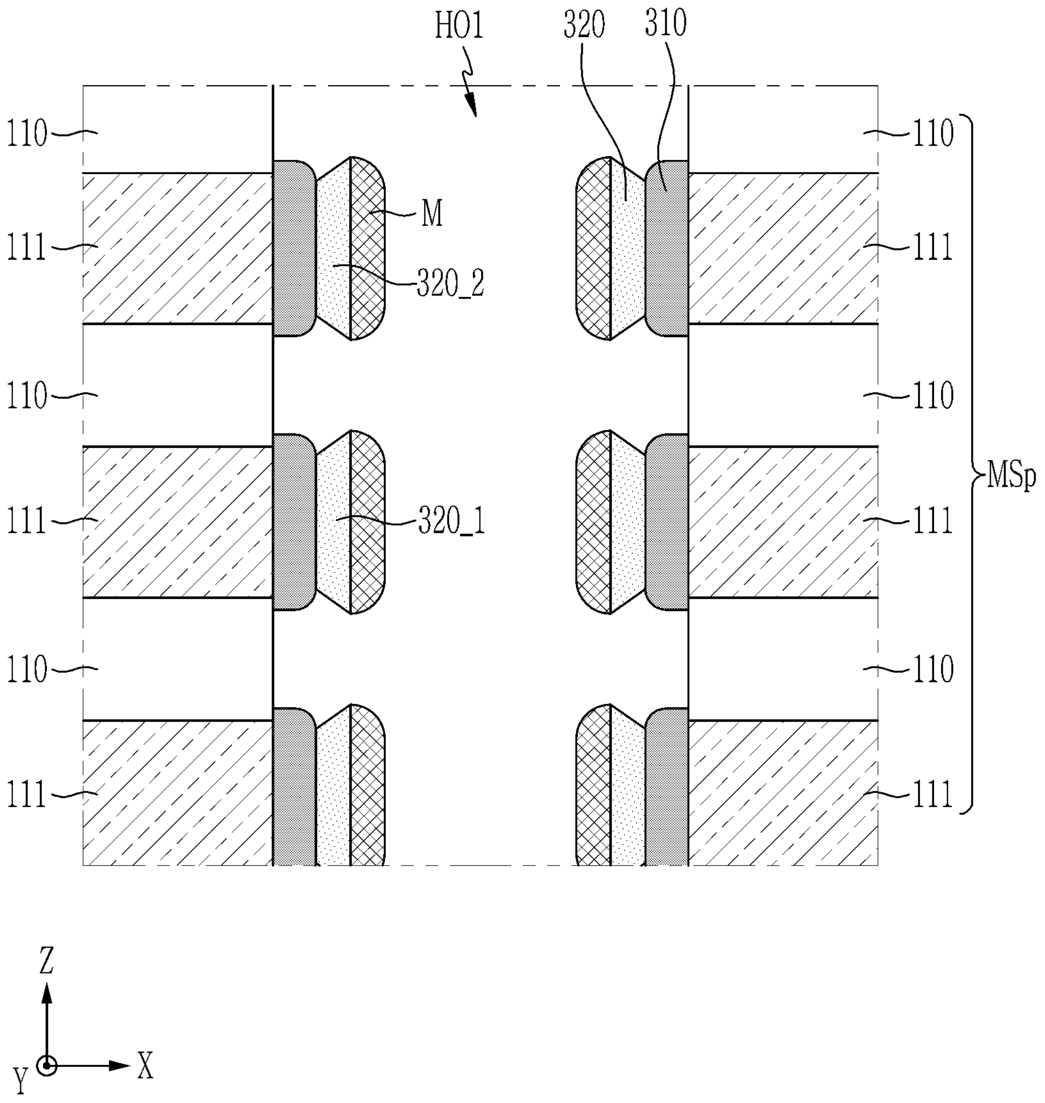
Figure 18:
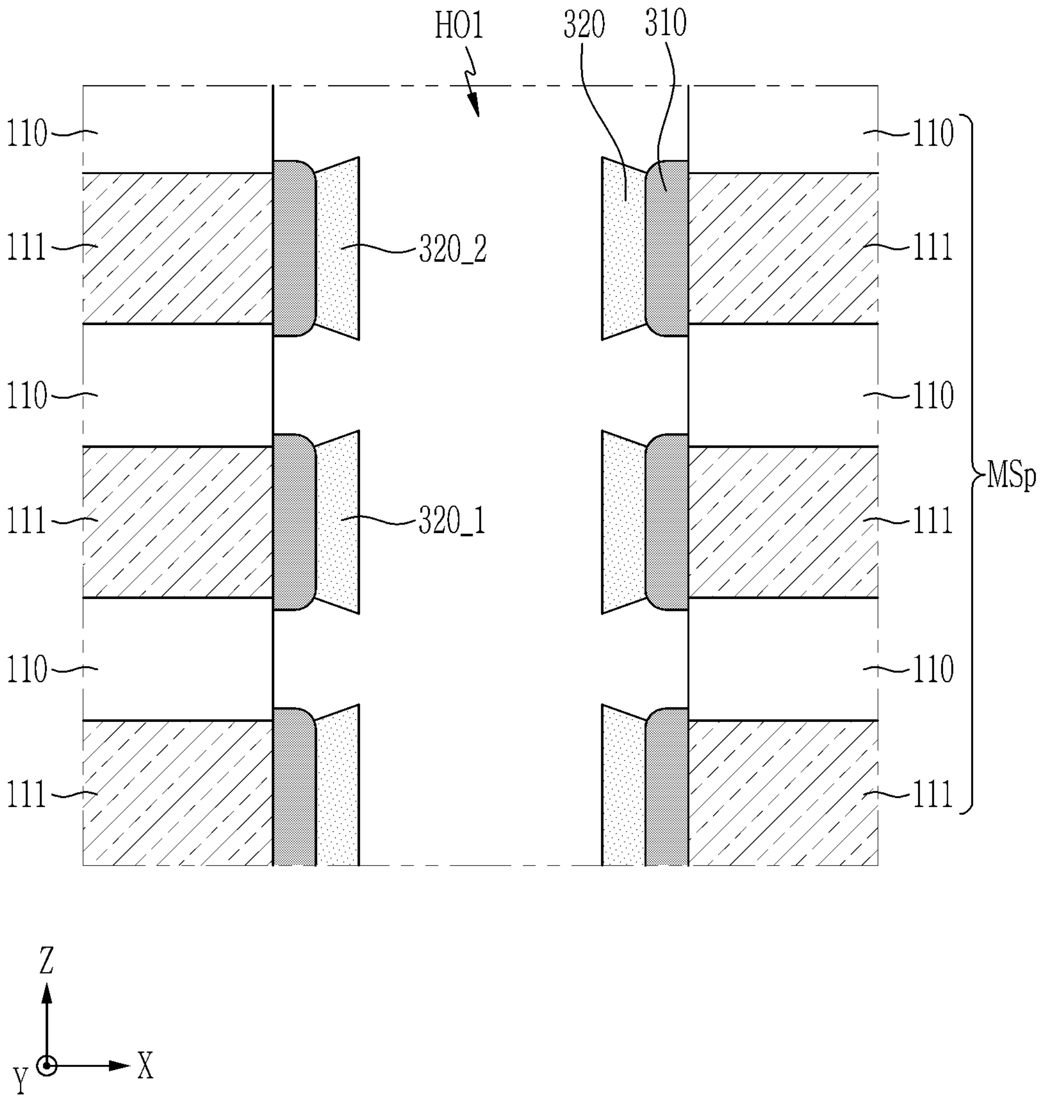

Referring to FIGS. 16 to 18, a plurality of separated charge storage layers 320 may be formed by forming a mask M in the second region AA2 of the preliminary charge storage layer 320A and etching the preliminary charge storage layer 320A. For example, the mask M may be formed on the preliminary charge storage layer 320A in the second region AA2. For example, the second region AA2 may not include the blocking pattern 321. In other words, the second region AA2 may be free of the blocking pattern 321.

First, referring to FIG. 16, a mask M which selectively covers only the preliminary charge storage layer 320A may be formed in the second region AA2. For example, the mask M may be formed on the charge storage layers 320 using the area selective deposition (ASD) process. The area selective deposition process may be performed using a material which has no or relatively very small (low) chemical affinity with the surfaces of the blocking patterns 321 and has relatively large (high) chemical affinity with the surfaces of the preliminary charge storage layer 320A.

The area selective deposition process may use a material having a selective ratio for the preliminary charge storage layer 320A. For example, the mask M may include silicon nitride, silicon-carbon-nitride, silicon-boron-nitride or polysilicon.

By doing this, the mask M may be formed only on the second region AA2 so that the mask M has a shape to expose the blocking pattern 321.

Next, referring to FIG. 17, a plurality of separated charge storage layers 320 may be formed by etching the preliminary charge storage layer 320A. For example, the mask M may expose the blocking pattern 321 corresponding to the first region AA1 and may not expose the preliminary charge storage layer 320A corresponding to the second region AA2. Next, when the etching process is performed in a state in which the mask M is formed, the blocking pattern 321 and the portion of the preliminary charge storage layer 320A corresponding to the first region AA1 may be etched. Accordingly, a first charge storage layer 320_1 and a second charge storage layer 320_2 which are separated may be formed by etching the preliminary charge storage layer 320A.

Referring to FIG. 18, masks M located on the charge storage layers 320 may be removed to expose separated charge storage layers 320.

Figure 19:
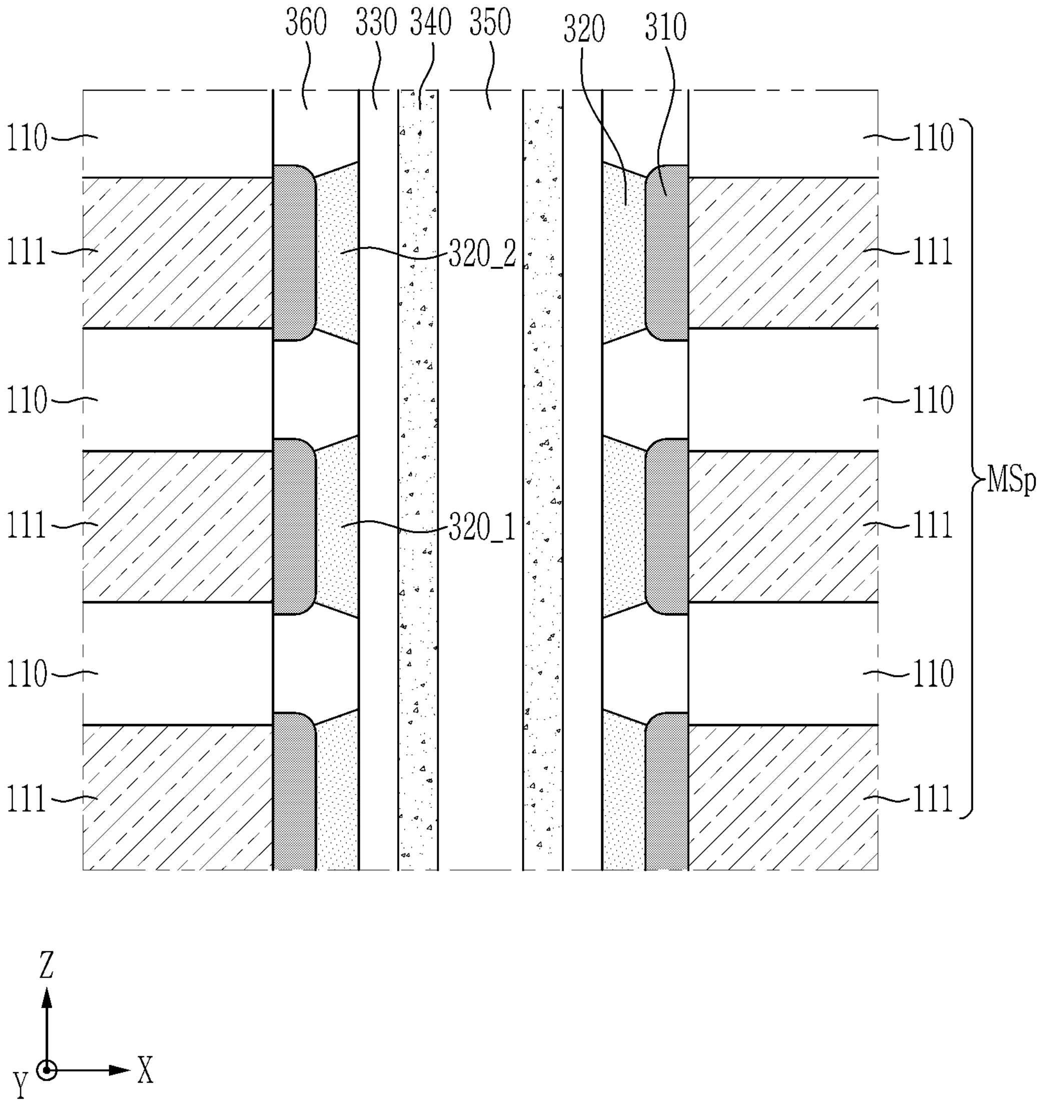

Referring to FIG. 19, the charge insulation layer 360 may be formed in the first hole HO1, and a tunnel insulation layer 330, a semiconductor pattern 340, and a filler insulation pattern 350 may be sequentially formed.

The charge insulation layer 360 may be interposed between the insulation patterns 110, the blocking insulation layers 310, and the charge storage layers 320 which are exposed in the second region AA2 by the etching process. That is, the charge insulation layer 360 may be filled in spaces in the first region AA1 between the charge storage layers 320 and between the blocking insulation layers 310. Accordingly, the charge storage layers 320 may be located between the charge insulation layers 360. For example, respective ones of the charge storage layers 320 may be located between adjacent ones of the charge insulation layers 360 in the third direction (Z direction). For example, the charge insulation layer 360 may be located between the first charge storage layer 320_1 and the second charge storage layer 320_2.

The charge insulation layer 360 includes an insulating material. Further, the charge insulation layer 360 may include a material different from that of the insulation patterns 110. For example, the charge insulation layers 360 may include silicon oxy carbide and each insulation pattern 110 may include silicon oxide. However, the present disclosure is not limited thereto and the charge insulation layer 360 may include the same material as the insulation patterns 110. That is, the charge insulation layer 360 may include silicon oxide.

The tunnel insulation layer 330, the semiconductor pattern 340, and the filler insulation pattern 350 may extend along a profile of the first hole HO1.

For example, the tunnel insulation layer 330 may include at least one of silicon nitride, silicon oxynitride, silicon rich nitride (Si-rich nitride) or nanocrystalline silicon (nanocrystalline Si). In some embodiments, the tunnel insulation layer 330 may have a substantially equivalent material configuration to the sacrificial layer 111. For example, the tunnel insulation layer 330 may include silicon nitride.

The semiconductor pattern 340 may be formed on the tunnel insulation layer 330 to extend along the third direction (Z direction), and the filler insulation pattern 350 may be formed on the semiconductor pattern 340 to extend along third direction (Z direction). Further, the filler insulation pattern 350 may be formed to be fully filled in the remaining region of the first hole HO1. For example, the filler insulation pattern 350 may include silicon oxide, but is not limited thereto.

By doing this, the semiconductor pattern 340 and the filler insulation pattern 350 which are formed to be filled in the first hole HO1 may configure a channel structure CS, and the blocking insulation layers 310, the charge storage layers 320, the tunnel insulation layer 330, the charge insulation layer 360, the semiconductor pattern 340, and the filler insulation pattern 350 may be formed to be fully filled in the first hole HO1.

Figure 20:
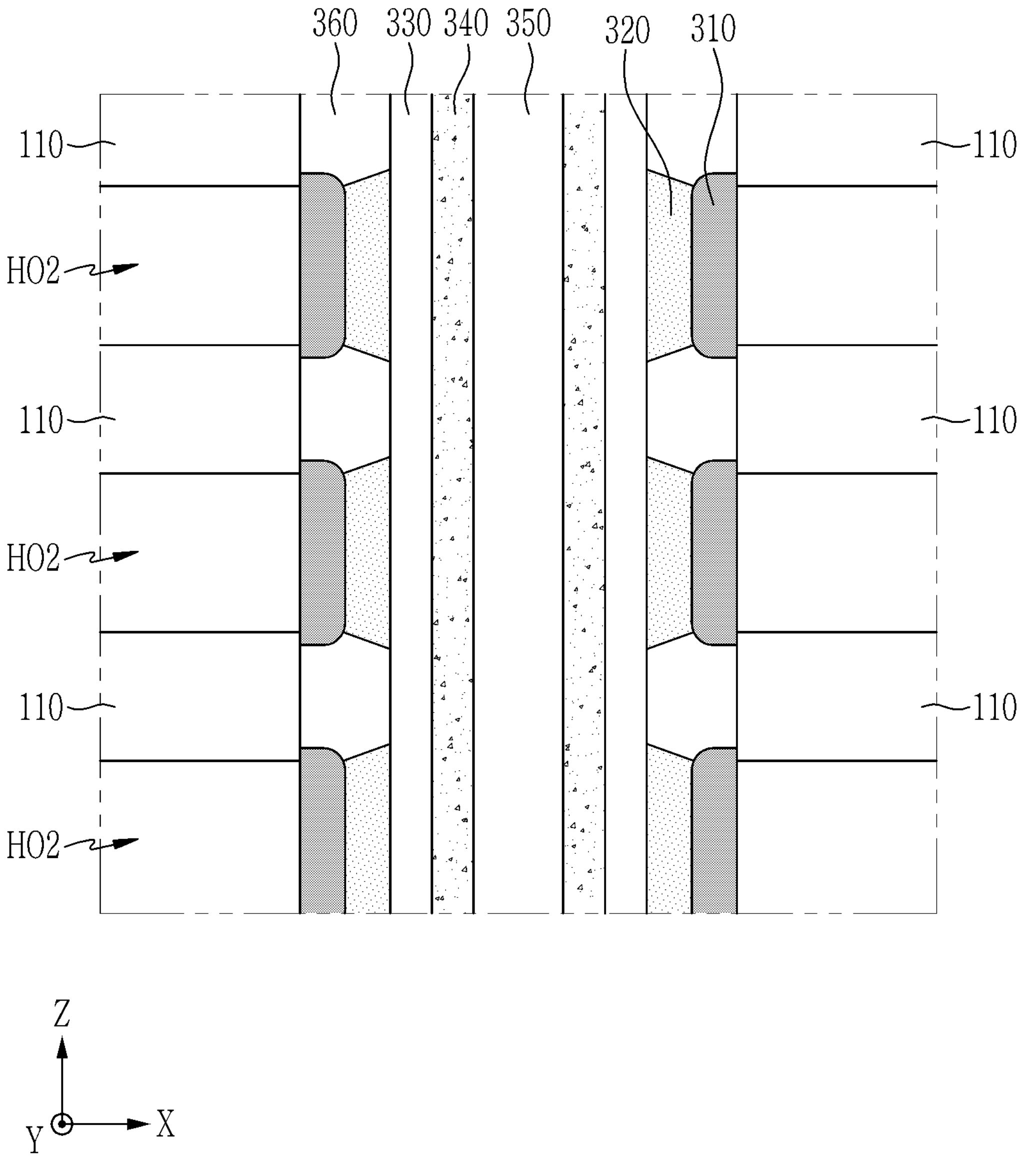

Referring to FIG. 20, the sacrificial layer 111 may be removed to form a second hole HO2 in the preliminary mold structure MSp. The second hole HO2 may be formed to extend in the first direction (X direction) between adjacent insulation patterns 110. The second hole HO2 may expose a part of the insulation patterns 110.

Figure 21:
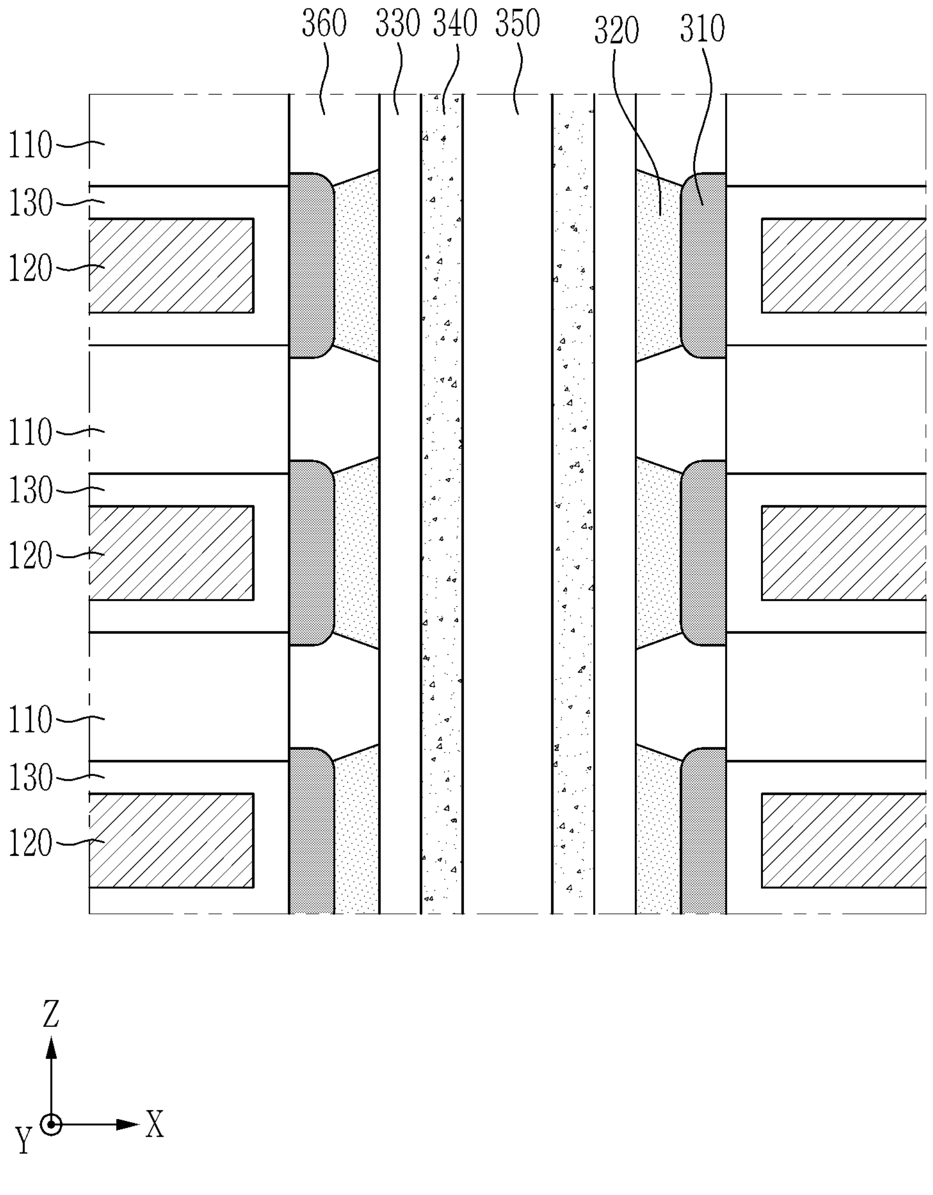

Referring to FIG. 21, the word lines ECL, GSL, WL11 to WL1*n*, WL21 to WL2*n*, and SSL may be sequentially formed in the second hole HO2. For example, the barrier layer 130 may be formed along a profile of the second hole HO2. Next, a gate electrode 120 which is filled in the second hole HO2 may be formed on the barrier layer 130. By doing this, each barrier layer 130 may be formed to enclose or at least partially surround each gate electrode 120. Accordingly, a plurality of word lines ECL, GSL, WL11 to WL1*n*, WL21 to WL2*n*, and SSL which are alternately laminated or stacked with the plurality of insulation patterns 110 may be formed.

Next, a bit line BL which is connected to the channel pad 150 may be formed (e.g., see FIG. 2), and thus a vertical non-volatile memory device may be manufactured.

While the present disclosure has been described in connection with what is presently considered to be practical embodiments, it is to be understood that the present disclosure is not limited to the disclosed example embodiments. On the contrary, the present disclosure is intended to cover various modifications and equivalent arrangements included within the scope of the appended claims.

What is claimed is:

1. A vertical non-volatile memory device, comprising:
- a cell substrate;
- a mold structure that includes a first insulation pattern, a first gate electrode, and a second insulation pattern which are sequentially stacked on the cell substrate;
- a semiconductor pattern that extends through the mold structure in a first direction intersecting a top surface of the cell substrate;
- a first charge insulation layer between the first insulation pattern and the semiconductor pattern;
- a second charge insulation layer spaced apart from the first charge insulation layer and between the second insulation pattern and the semiconductor pattern;
- a charge storage layer between the first charge insulation layer and the second charge insulation layer and between the first gate electrode and the semiconductor pattern; and
- a first blocking insulation layer between the first gate electrode and the charge storage layer,
- wherein a first length in the first direction of the first gate electrode is shorter than a second length in the first direction of a first surface of the charge storage layer which is in contact with the first blocking insulation layer,
- wherein a third length in the first direction of a second surface of the charge storage layer which is opposite to the semiconductor pattern is longer than the second length.

2. The vertical non-volatile memory device of claim 1, wherein the first blocking insulation layer is between the first charge insulation layer and the second charge insulation layer.

3. The vertical non-volatile memory device of claim 1, wherein a fourth length in the first direction of the first blocking insulation layer is longer than the first length.

4. The vertical non-volatile memory device of claim 1, further comprising a barrier layer between the first insulation pattern and the first gate electrode and between the second insulation pattern and the first gate electrode,
- wherein a fifth length of the barrier layer in the first direction is shorter than the third length.

5. The vertical non-volatile memory device of claim 4, wherein the barrier layer is between the first blocking insulation layer and the first gate electrode.

6. The vertical non-volatile memory device of claim 1, wherein a length of the charge storage layer in the first direction increases toward the semiconductor pattern.

7. The vertical non-volatile memory device of claim 1, wherein the first charge insulation layer includes a material different from that of the first insulation pattern.

8. The vertical non-volatile memory device of claim 7, wherein the second charge insulation layer includes a material different from that of the second insulation pattern.

9. A vertical non-volatile memory device, comprising:
- a cell substrate;
- a mold structure that includes a first gate electrode, an insulation pattern, and a second gate electrode which are sequentially stacked on the cell substrate;
- a semiconductor pattern that extends through the mold structure in a first direction intersecting a top surface of the cell substrate;
- a first charge storage layer between the first gate electrode and the semiconductor pattern;
- a second charge storage layer spaced apart from the first charge storage layer and between the second gate electrode and the semiconductor pattern;
- a first blocking insulation layer between the first gate electrode and the first charge storage layer; and
- a second blocking insulation layer spaced apart from the first blocking insulation layer and between the second gate electrode and the second charge storage layer,
- wherein a first distance between the first charge storage layer and the second charge storage layer is shorter than a second distance between the first gate electrode and the second gate electrode,
- wherein the first distance decreases as the first and second charge storage layers extend closer to the semiconductor pattern.

10. The vertical non-volatile memory device of claim 9, wherein a third distance between the first blocking insulation layer and the second blocking insulation layer is shorter than the second distance.

11. The vertical non-volatile memory device of claim 9, further comprising:
- a first barrier layer between the first gate electrode and the insulation pattern; and
- a second barrier layer between the second gate electrode and the insulation pattern,
- wherein a fourth distance between the first barrier layer and the second barrier layer is shorter than the first distance.

12. The vertical non-volatile memory device of claim 9, further comprising a charge insulation layer between the first charge storage layer and the second charge storage layer.

13. The vertical non-volatile memory device of claim 12, wherein a surface of the first charge storage layer is in contact with the charge insulation layer and has a concave shape.

14. The vertical non-volatile memory device of claim 12, wherein the charge insulation layer includes a material different from that of the insulation pattern.

15. The vertical non-volatile memory device of claim 12, wherein the charge insulation layer is between the first blocking insulation layer and the second blocking insulation layer.

* * * * *